(12) United States Patent
Forrest et al.

(10) Patent No.: US 11,342,526 B2
(45) Date of Patent: May 24, 2022

(54) HYBRID ORGANIC LIGHT EMITTING DEVICE

(71) Applicants: The Regents of the University of Michigan, Ann Arbor, MI (US); The University of Southern California, Los Angeles, CA (US)

(72) Inventors: Stephen R. Forrest, Ann Arbor, MI (US); Chan Ho Soh, Ann Arbor, MI (US); Mark E. Thompson, Anaheim, CA (US); Muazzam Idris, Los Angeles, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 99 days.

(21) Appl. No.: 16/745,851

(22) Filed: Jan. 17, 2020

(65) Prior Publication Data
US 2020/0243786 A1 Jul. 30, 2020

Related U.S. Application Data

(60) Provisional application No. 62/798,225, filed on Jan. 29, 2019.

(51) Int. Cl.
*H01L 51/50* (2006.01)

(52) U.S. Cl.
CPC ........ *H01L 51/504* (2013.01); *H01L 51/5016* (2013.01); *H01L 2251/5346* (2013.01)

(58) Field of Classification Search
CPC .............................................. H01L 2251/5346
See application file for complete search history.

(56) References Cited

U.S. PATENT DOCUMENTS

| | | | |
|---|---|---|---|
| 4,769,292 A | 9/1988 | Tang | |
| 5,247,190 A | 9/1993 | Friend | |
| 5,703,436 A | 12/1997 | Forrest | |
| 5,707,745 A | 1/1998 | Forrest | |

(Continued)

FOREIGN PATENT DOCUMENTS

| | | |
|---|---|---|
| EP | 1238981 | 9/2002 |
| JP | 2010135467 | 6/2010 |

(Continued)

OTHER PUBLICATIONS

Baldo et al., "Highly Efficient Phosphorescent Emission from Organic Electroluminescent Devices," Nature, vol. 395,151-154, (1998).

(Continued)

*Primary Examiner* — Alia Sabur
(74) *Attorney, Agent, or Firm* — Riverside Law LLP

(57) ABSTRACT

An OLED device comprises an anode and a cathode, and at least one graded emissive layer disposed between the anode and the cathode, the graded emissive layer comprising first and second materials, wherein a concentration of the first material increases continuously from an anode side of the graded emissive layer to a cathode side of the graded emissive layer, and a concentration of the second material decreases continuously from the anode side of the graded emissive layer to the cathode side of the graded emissive layer. An OLED device comprising a graded emissive layer and a hybrid white OLED device are also described.

17 Claims, 17 Drawing Sheets

(56) References Cited

U.S. PATENT DOCUMENTS

| | | | |
|---|---|---|---|
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2006/0279203 | A1* | 12/2006 | Forrest ............. H01L 51/5096 313/504 |
| 2009/0026937 | A1* | 1/2009 | Kinoshita .......... H01L 51/5012 313/504 |
| 2009/0026938 | A1* | 1/2009 | Okada ............... H01L 51/5016 313/504 |
| 2013/0026452 | A1 | 1/2013 | Kottas |
| 2013/0119354 | A1 | 5/2013 | Ma |

FOREIGN PATENT DOCUMENTS

| | | |
|---|---|---|
| WO | 2004111066 | 12/2004 |
| WO | 2008044723 | 4/2008 |
| WO | 2008057394 | 5/2008 |
| WO | 2010011390 | 1/2010 |
| WO | 2010111175 | 9/2010 |

OTHER PUBLICATIONS

Baldo et al., "Very high-efficiency green organic light-emitting devices based on electrophosphorescence," Appl. Phys. Lett., vol. 75, No. 3, 4-6 (1999).

Sun, Y. et al. Management of singlet and triplet excitons for efficient white organic light emitting devices. Nature 440, 908-912 (2006).

Schwartz, G., Walzer, K., Pfeiffer, M. & Leo, K. High-efficiency white organic-light-emitting diodes combining fluorescent and phosphorescent emitter systems. 61920Q (2006). doi:10.1117/12.660524, 7 pages.

Reineke, S. et al. White organic light-emitting diodes with fluorescent tube efficiency. Nature 459, 234-238 (2009).

Kanno, B. H., Holmes, R. J., Sun, Y., Kena-cohen, S. & Forrest, S. R. White Stacked Electrophosphorescent Organic Light-Emitting Devices Employing MoO 3 as a Charge-Generation Layer**. 339-342 (2006). doi:10.1002/adma.200501915.

Chuen, C. H. & Tao, Y. T. Highly-bright white organic light-emitting diodes based on a single emission layer. 4499, 79-82 (2002).

Coburn, C., Jeong, C. & Forrest, S. R. Reliable, all-phosphorescent stacked white organic light emitting devices with a high color rendering index. ACS Photonics acsphotonics.7b01213 (2017). doi:10.1021/acsphotonics.7b01213, 6 pages.

Schwartz, G., Pfeiffer, M., Reineke, S., Walzer, K. & Leo, K. Harvesting triplet excitons from fluorescent blue emitters in white organic light-emitting diodes. Adv. Mater. 19, 3672-3676 (2007).

Schwartz, G., Reineke, S., Walzer, K. & Leo, K. Reduced efficiency roll-off in high-efficiency hybrid white organic light-emitting diodes. Appl. Phys. Lett. 92, 2006-2009 (2008).

Schwartz, G., Reineke, S., Rosenow, T. C., Walzer, K. & Leo, K. Triplet harvesting in hybrid white organic light-emitting diodes. Adv. Fund. Mater. 19, 1319-1333 (2009).

Baldo, M. a., O'Brien, D. F. & Forrest, S. R. Excitonic singlet-triplet ratio in a semiconducting organic thin film. Phys. Rev. B 60, 14422-14428 (1999).

Forrest, S. R., Bradley, D. D. C. & Thompson, M. E. Measuring the Efficiency of Organic Light-Emitting Devices. Adv. Mater. 15, 1043-1048 (2003).

Reineke, S., Schwartz, G., Walzer, K. & Leo, K. Reduced efficiency roll-off in phosphorescent organic light emitting diodes by suppression of triplet-triplet annihilation by suppression of triplet-triplet annihilation. Appl. Phys. Lett. 123508, 1-4 (2010).

Giebink, N. C. & Forrest, S. R. Quantum efficiency roll-off at high brightness in fluorescent and phosphorescent organic light emitting diodes. Phys. Rev. B—Condens. Matter Mater. Phys. 77, 1-9 (2008).

Kim, J., Lee, C.-H. & Kim, J.-J. Mobility balance in the light-emitting layer governs the polaron accumulation and operational stability of organic light-emitting diodes. 203301, 1-6 (2017).

Lee, J. et al. Hot excited state management for long-lived blue phosphorescent organic light-emitting diodes. Nat. Commun. 8, 1-9 (2017).

Coburn, C., Lee, J. & Forrest, S. R. Charge Balance and Exciton Confinement in Phosphorescent Organic Light Emitting Diodes. Adv. Opt. Mater. 4, 889-895 (2016).

Zhang, Y., Lee, J. & Forrest, S. R. Tenfold increase in the lifetime of blue phosphorescent organic light-emitting diodes. Nat. Commun. 5, 5008 (2014), 7 pages.

Coburn, C. & Forrest, S. R. Effects of Charge Balance and Exciton Confinement on the Operational Lifetime of Blue Phosphorescent Organic Light-Emitting Diodes. Phys. Rev. Appl. 7, 1-5 (2017).

Baldo, M. A., Thompson, M. E. & Forrest, S. R. High-efficiency fluorescent organic light-emitting devices using a phosphorescent sensitizer. Nature 403, 750-753 (2000).

D'Andrade, B. W. et al. High-efficiency yellow double-doped organic light-emitting devices based on phosphor-sensitized fluorescence. Appl. Phys. Lett. 79, 1045-1047 (2001).

Zhao, Y. & Chen, J. Ultrathin Nondoped Emissive Layers for E ffi cient and Simple Monochrome and White Organic Light-Emitting Diodes. 965-971 (2013). doi:10.1021/am3026097.

Wu, S., Li, S., Sun, Q., Huang, C. & Fung, M. K. Highly efficient white organic light-emitting diodes with ultrathin emissive layers and a spacer-free structure. Sci. Rep. 6, 4-11 (2016).

Zhang, Y. & Forrest, S. R. Triplet diffusion leads to triplet-triplet annihilation in organic phosphorescent emitters. Chem. Phys. Lett. 590, 106-110 (2013).

* cited by examiner

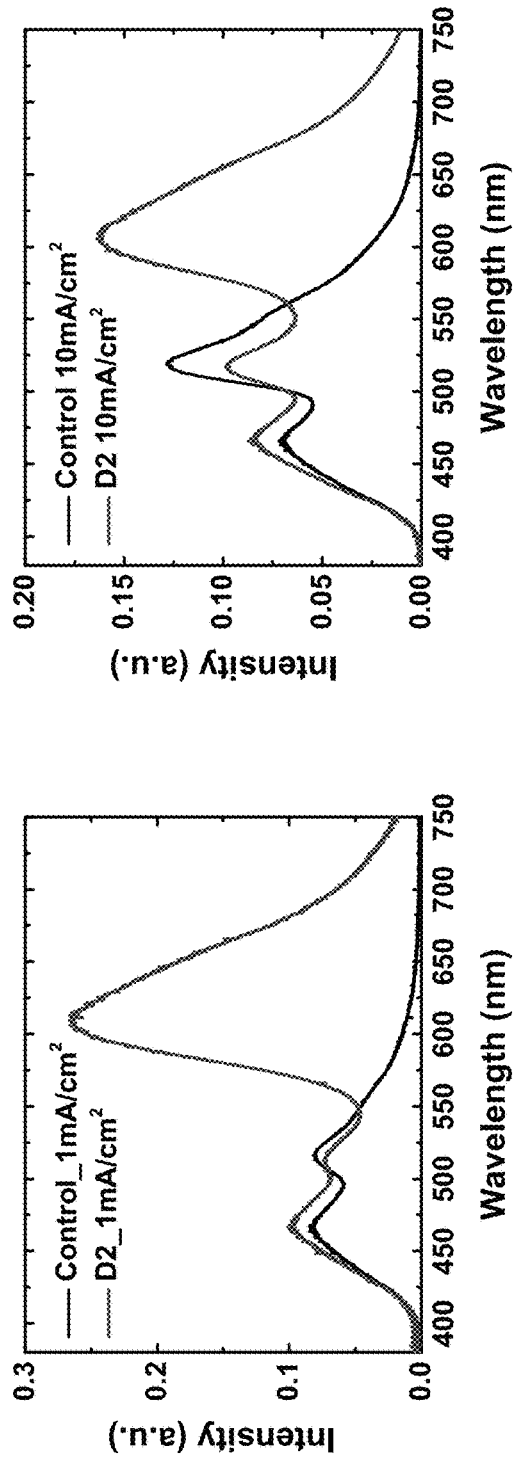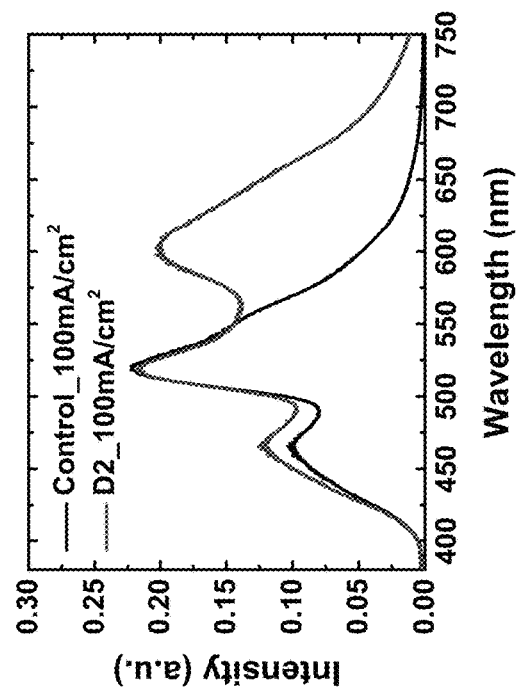
Fig. 11A
Fig. 11B
Fig. 11C

HYBRID ORGANIC LIGHT EMITTING DEVICE

CROSS-REFERENCE TO RELATED APPLICATIONS

This application claims priority to U.S. Provisional Application No. 62/798,225, filed on Jan. 29, 2019, incorporated herein by reference in its entirety.

STATEMENT REGARDING FEDERALLY SPONSORED RESEARCH OR DEVELOPMENT

This invention was made with government support under grant no. DE-EE0008244, awarded by the US Department of Energy. The government has certain rights in the invention.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety. One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

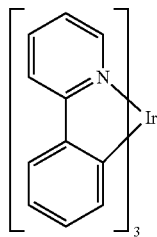

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

White organic light emitting devices (WOLEDs) are employed in both displays and lighting due to their high efficiency, spectral tunability, and unique form factors. Architectures developed to achieve highly efficient WOLEDs include structures with single emission layers, multiple emission zones separated by non-emitting spacers, stacked elements separated by charge generation layers, and so on. Whereas some high efficiency WOLEDs employ only phosphorescent emitters, others combine fluorescent blue emitters with red and green emitting phosphors. These so-called hybrid blue fluorescence plus red and green phosphorescence WOLEDs exploit the statistical 1:3 formation ratio of singlets to triplets by simultaneously generating both species in a single emission zone. The triplets have extended lifetimes compared to singlets, and thus have longer diffusion lengths. Consequently, blue fluorescent emitters are typically placed directly at the exciton formation zone, whereas red and green phosphorescent emitters are remotely located, but within the triplet diffusion length from the point of exciton generation. Singlets are then used to emit blue light which, fortuitously, constitutes approximately 25% of the color content needed for white emission, while the remaining triplets generate red and green light. The result is a color-balanced WOLED with 100% internal quantum efficiency (IQE) that circumvents problems associated with using blue phosphors such as a short operational lifetime and exchange energy losses.

Hybrid WOLEDs have been studied since their introduction in 2006 by Sun et al (Sun, Y. et al. Management of singlet and triplet excitons for efficient white organic light-emitting devices. *Nature* 440, 908-912 (2006), incorporated herein by reference in its entirety). In those devices, the requirement that the blue fluorophore have a higher triplet energy compared to its host was not satisfied. The blue fluorophore can trap triplets if its triplet energy is lower than in the host, resulting in a loss channel for exciton emission. To minimize trapping, the fluorophore is typically doped at low concentration, although this has still been found to result in a low external quantum efficiency, suggesting that significant triplet losses persist. These losses are made more severe at high brightness operation due to annihilation between long-lived triplets and polarons as the current density is increased.

Disclosed herein is a method to reduce the roll-off by oppositely grading the electron transporting host with a hole transporting material within the emission zone to balance the electron and hole mobilities. The disclosed systems and methods evenly distribute both charges and excitons, thereby reducing bimolecular annihilation at high brightness. The disclosed devices are engineered to have peak efficiency at a lighting-relevant brightness of 1000 cd/m$^2$. Furthermore, disclosed results show that even ultrathin (0.05 nm) layers of a phosphorescent emitting molecule embedded in a host can result in very high emission efficiencies even at high brightness. The present disclosure outlines a strategy for designing hybrid WOLEDs with high efficiency at practical brightness.

SUMMARY

In one aspect, an OLED device comprises an anode and a cathode, and at least one graded emissive layer disposed between the anode and the cathode, the graded emissive layer comprising first and second materials, wherein a concentration of the first material increases continuously from an anode side of the graded emissive layer to a cathode side of the graded emissive layer, and a concentration of the second material decreases continuously from the anode side of the graded emissive layer to the cathode side of the graded emissive layer.

In one embodiment, the first material has a concentration of between 0% and 30% on the anode side of the graded emissive layer and a concentration of between 70% and 100% on the cathode side of the graded emissive layer, and the second material has a concentration of between 70% and 100% on the anode side of the graded emissive layer and a concentration of between 0% and 30% on the cathode side of the graded emissive layer. In one embodiment, the first material has a concentration of about 20% on the anode side of the graded emissive layer and a concentration of about 100% on the cathode side of the graded emissive layer, and the second material has a concentration of about 80% on the anode side of the graded emissive layer and about 0% on the cathode side of the graded emissive layer.

In one embodiment, the first material comprises I5. In one embodiment, the second material comprises CBP. In one embodiment, the device further comprises at least one non-graded emissive layer disposed between the anode and the cathode. In one embodiment, the non-graded emissive layer is disposed between the graded emissive layer and the anode. In one embodiment, the graded emissive layer is a blue emissive layer and the non-graded emissive layer is selected from the group consisting of a green emissive layer and a red emissive layer. In one embodiment, the graded emissive layer is a blue emissive layer. In one embodiment, the OLED device is a white OLED. In one embodiment, the OLED device is a hybrid white OLED. In one embodiment, the graded emissive layer is a blue fluorescent emissive layer, and further comprising red and green phosphorescent emissive layers disposed between the anode and the cathode.

In one embodiment, the concentration of the first material increases linearly, and the concentration of the second material decreases linearly. In one embodiment, the concentration of the first material increases parabolically, and the concentration of the second material decreases parabolically. In one embodiment, the concentration of the first material increases logarithmically, and the concentration of the second material decreases logarithmically. In one embodiment, at least one of a rate of increasing concentration of the first material and a rate of decreasing concentration of the second material is variable.

In one embodiment, a product comprising an OLED device as disclosed herein is selected from the group consisting of a flat panel display, a curved display, a computer monitor, a medical monitor, a television, a billboard, a lights for interior or exterior illumination and/or signaling, a heads-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3-D display, a virtual reality display, an augmented reality display, a vehicle, a video wall comprising multiple displays tiled together, a theater or stadium screen, and a sign.

In another aspect, an OLED device comprises a graded emissive layer, the graded emissive layer comprising a first material having a first continuous volumetric concentration gradient in a first direction across a thickness of the layer and a second material having a second continuous volumetric concentration gradient opposite the first direction. In one embodiment, the first continuous volumetric concentration gradient ranges from a first concentration of between 0% and 30% and a second concentration of between 70% and 100%, and the continuous volumetric concentration gradient ranges from a third concentration of between 70% and 100% and a fourth concentration of between 0% and 30%.

In one embodiment, the first concentration is about 20%, the second concentration is about 100%, the third concentration is about 80%, and the fourth concentration is about 0%. In one embodiment, the first material comprises I5. In one embodiment, the second material comprises CBP. In one embodiment, the device comprises an anode and a cathode, the graded emissive layer positioned between the anode and the cathode.

In one embodiment, the device further comprises at least one non-graded emissive layer disposed between the anode and the cathode. In one embodiment, the non-graded emissive layer is disposed between the graded emissive layer and the anode. In one embodiment, the graded emissive layer is a blue emissive layer and the non-graded emissive layer is selected from the group consisting of a green emissive layer and a red emissive layer. In one embodiment, the graded emissive layer is a blue emissive layer. In one embodiment, the OLED device is a white OLED. In one embodiment, the OLED device is a hybrid white OLED. In one embodiment, the graded emissive layer is a blue fluorescent emissive layer, and further comprising red and green phosphorescent emissive layers.

In one embodiment, the first and second continuous volumetric gradients are linear. In one embodiment, the first and second continuous volumetric gradients are parabolic. In one embodiment, the first and second continuous volumetric gradients are logarithmic. In one embodiment, at least one of the first and second continuous volumetric gradients is a variable gradient.

In another aspect, a hybrid white OLED device comprises at least red and blue phosphorescent emissive layers disposed between the anode and the cathode, and at least one blue fluorescent graded emissive layer, the graded emissive layer comprising first and second materials and having first and second surfaces, wherein a concentration of the first material increases continuously from the first surface of the graded emissive layer to the second surface of the graded emissive layer, and a concentration of the second material decreases continuously from the first surface of the graded emissive layer to the second surface of the graded emissive layer.

In one embodiment, the first material has a concentration of between 0% and 30% on the first surface of the graded emissive layer and a concentration of between 70% and 100% on the second surface of the graded emissive layer, and the second material has a concentration of between 70% and 100% on the first surface of the graded emissive layer and a concentration of between 0% and 30% on the second surface of the graded emissive layer. In one embodiment, the first material has a concentration of about 20% on the first surface of the graded emissive layer and a concentration of about 100% on the second surface of the graded emissive layer, and the second material has a concentration of about 80% on the first surface of the graded emissive layer and about 0% on the second surface of the graded emissive layer.

In one embodiment, the first material comprises I5. In one embodiment, the second material comprises CBP.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which:

FIG. 11A is a graph of spectra for two devices at 1 mA/cm$^2$;

FIG. 11B is a graph of spectra for two devices at 10 mA/cm$^2$; and

FIG. 11C is a graph of spectra for two devices at 100 mA/cm$^2$.

DETAILED DESCRIPTION

Figure 1:
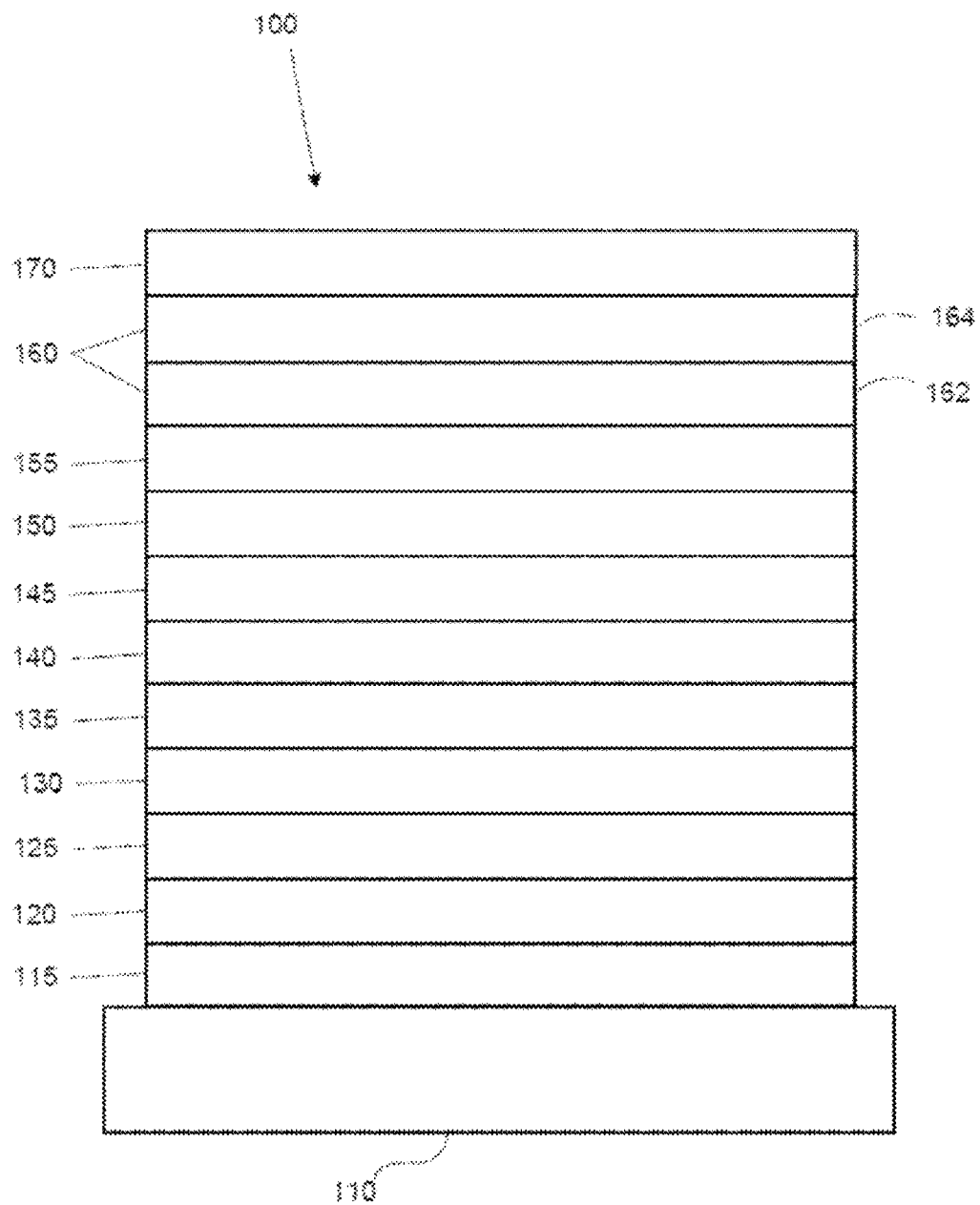
FIG. 1 is an organic light emitting device.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
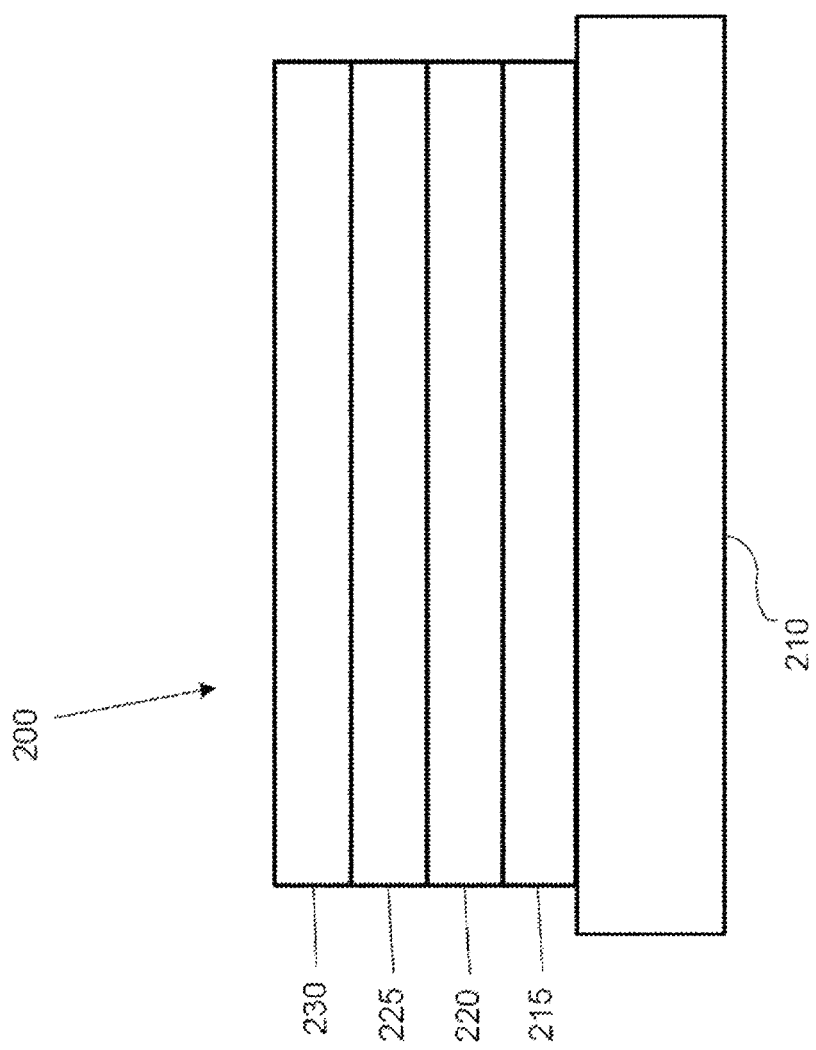
FIG. 2 is an inverted organic light emitting device.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers.

The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

As used herein, the term "graded layer" refers to a layer comprising more than one material having a concentration gradient across the thickness of the layer. A "graded emissive layer" is a graded layer comprising one or more emissive materials. In some embodiments, a graded layer has two materials, each having a continuous concentration gradient across the thickness of the layer, with the gradients oriented in opposite directions. For example, in one embodiment, a graded layer comprises first and second materials, wherein the first material increases in concentration across the thickness of the layer in one direction, while the second material decreases in concentration across the thickness of the layer in the same direction.

A gradient as disclosed herein may be described as a continuous volumetric concentration gradient, where the volumetric concentrations of at least two materials vary along an axis within a layer. Gradients may be defined by a variety of parameters, for example the concentrations of each of the materials at either end of the gradient, as well as the rate of change of concentration along the axis of the gradient. In some embodiments, volumetric concentrations along an axis of a gradient may follow a linear, parabolic, logarithmic, or any other mathematical definition along the gradient axis. In some embodiments, a continuous volumetric concentration gradient may be a variable gradient, meaning that the gradient may be divided up into multiple segments, wherein at least one segment of the gradient follows a different mathematical definition from at least one other segment of the gradient. In one example, a continuous volumetric concentration gradient may extend halfway through the graded layer (a first segment) with volumetric concentration of two materials changing at a linear pace along the gradient axis, then after the midway point of the graded layer (the second segment), proceed at a parabolic rate until the opposite end of the graded layer.

Figure 3A:
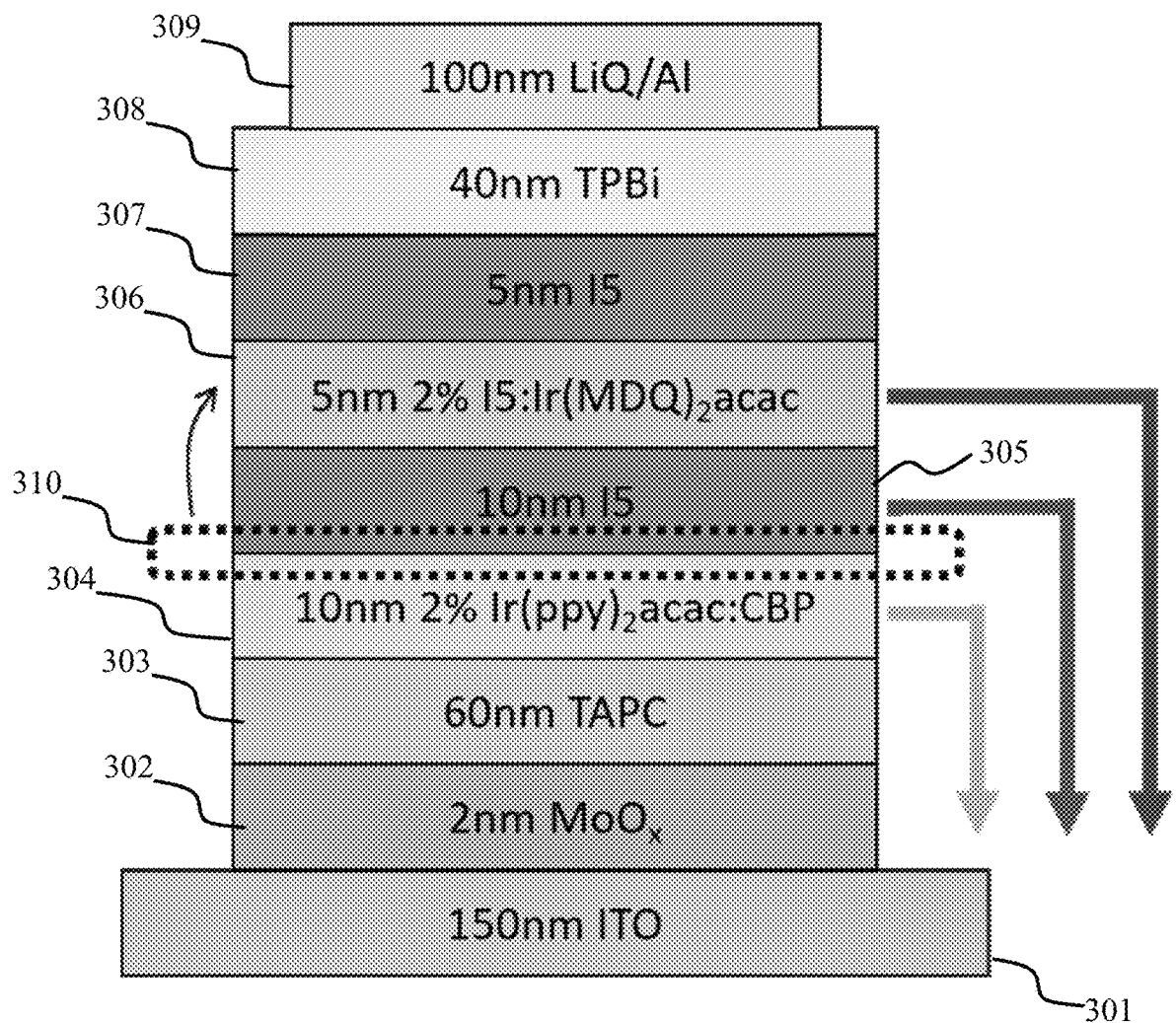
FIG. 3A is an exemplary organic light emitting device.

An exemplary device structure of a neat I5 hybrid WOLED device is shown in FIG. 3A. The layers comprise the following compounds, abbreviated throughout the disclosure as follows:

Blue fluorophore, 1-phenyl-2-(4-(pyridin-4-yl)phenyl)-1H-phenanthro[9,10-d]imidazole is abbreviated herein as "I5" (or interchangeably as "PPPyPI") The chemical structure of I5 is shown below.

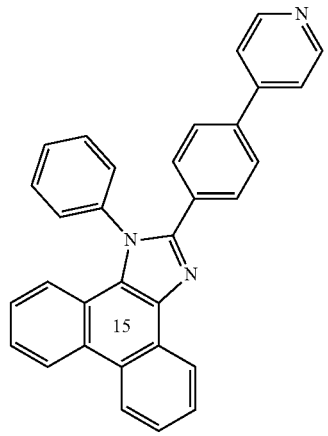 [SMILES: c1ccc(-n2c(-c3ccc(-c4ccncc4)cc3)nc3c4ccccc4c4ccccc4c32)cc1]

Red and green emitting phosphors, bis(2-methyldibenzo [f,h]quinoxaline)(acetylacetonate) iridium(III) (hereinafter "Ir(MDQ)$_2$acac") and bis(2-phenylpyridine)(acetylacetonate)iridium(III) (hereinafter "Ir(ppy)$_2$acac"), respectively.

di-[4-(N,N-di-p-tolyl-amino)-phenyl]cyclohexane is abbreviated herein as "TAPC."

4,4'-bis-(N-carbazolyl)-1,1'-biphenyl is abbreviated herein as "CBP."

1,3,5-Tris(1-phenyl-1H-benzimidazol-2-yl)benzene is abbreviated herein as "TPBi."

8-hydroxyquinolinato lithium is abbreviated herein as "LiQ."

indium-tin oxide is abbreviated herein as "ITO."

The device 300 comprises an ITO anode layer 301 having a thickness of 150 nm, a MoO$_3$ hole injection layer 302 having a thickness of 2 nm, a TAPC hole transport layer 303 having a thickness of 60 nm, followed by a set of emissive layers. The exemplary set of emissive layers comprises a green emissive layer 304, comprising CBP doped with 2% by volume Ir(ppy)$_2$acac and having a thickness of 10 nm, a blue emissive layer 305, comprising I5 and having a thickness of 10 nm, and a red emissive layer 306 comprising I5 doped with 1% by volume Ir(MDQ)$_2$acac and having a thickness of 5 nm. The emitting layers are followed by a further layer 307 of I5 having a thickness of 5 nm, an electron transport layer 308 comprising TPBi, having a thickness of 40 nm, an electron injection layer (not shown) comprising LiQ and having a thickness of 1.5 nm, and a cathode 309 comprising Al and having a thickness of 100 nm. In the depicted embodiment, the exciton formation zone 310 is at the boundary of the green emissive layer 304 and the blue emissive layer 305.

Figure 9A:
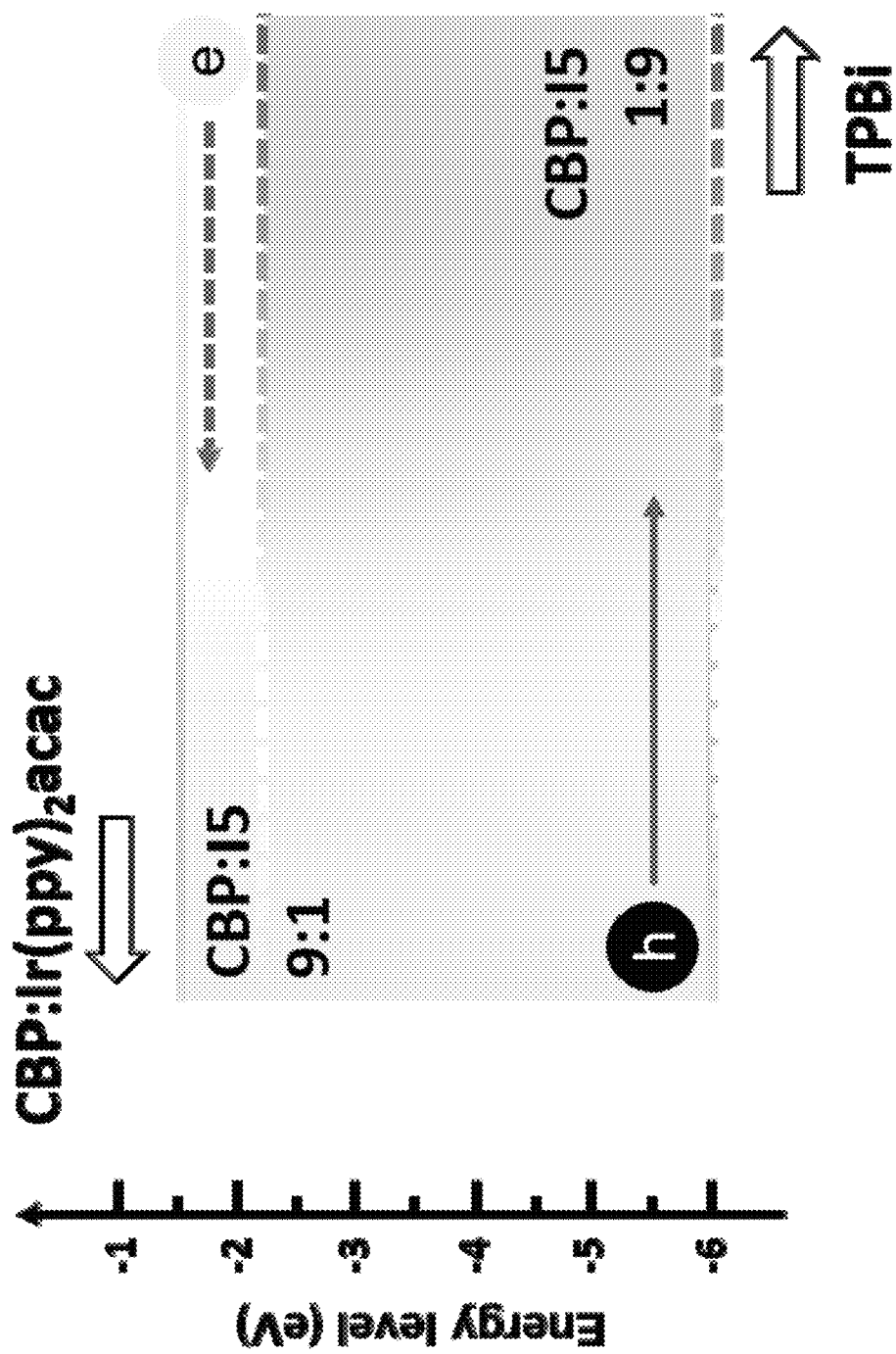
FIG. 9A is a diagram of material concentrations in an exemplary graded layer.

In some embodiments, the layers 304 and 305 may be partially or wholly replaced with a single graded layer including continuously increasing and decreasing concentrations of the two materials as shown in FIG. 9A. In the depicted embodiment, I5 is linearly graded from 10 vol % to 90 vol %, and CBP graded from 90 vol % to 10 vol % from the anode to the cathode side. In some embodiments, the proportions may vary from 100 vol % to 0 vol %, or 80 vol % to 20 vol %, or 70 vol % to 30 vol %, or any suitable proportion range. In some embodiments, the concentration by volume of either I5 or CBP may increase linearly, while in other embodiments the concentration may increase logarithmically, parabolically, or geometrically. In some embodiments, a graded layer may comprise multiple sections, wherein some or all sections have a different gradient than the others. For example, a graded layer may include a first section wherein the volumetric concentration gradient is linear, and a second section where the volumetric concentration gradient is parabolic. In some embodiments a graded layer may comprise multiple sections wherein some or all of the multiple sections comprise different materials. In some embodiments a graded layer may comprise only two materials in varying concentrations, while in other embodiments three or more materials may be mixed in varying concentrations across some or all of the thickness of the graded layer.

Figure 3B:
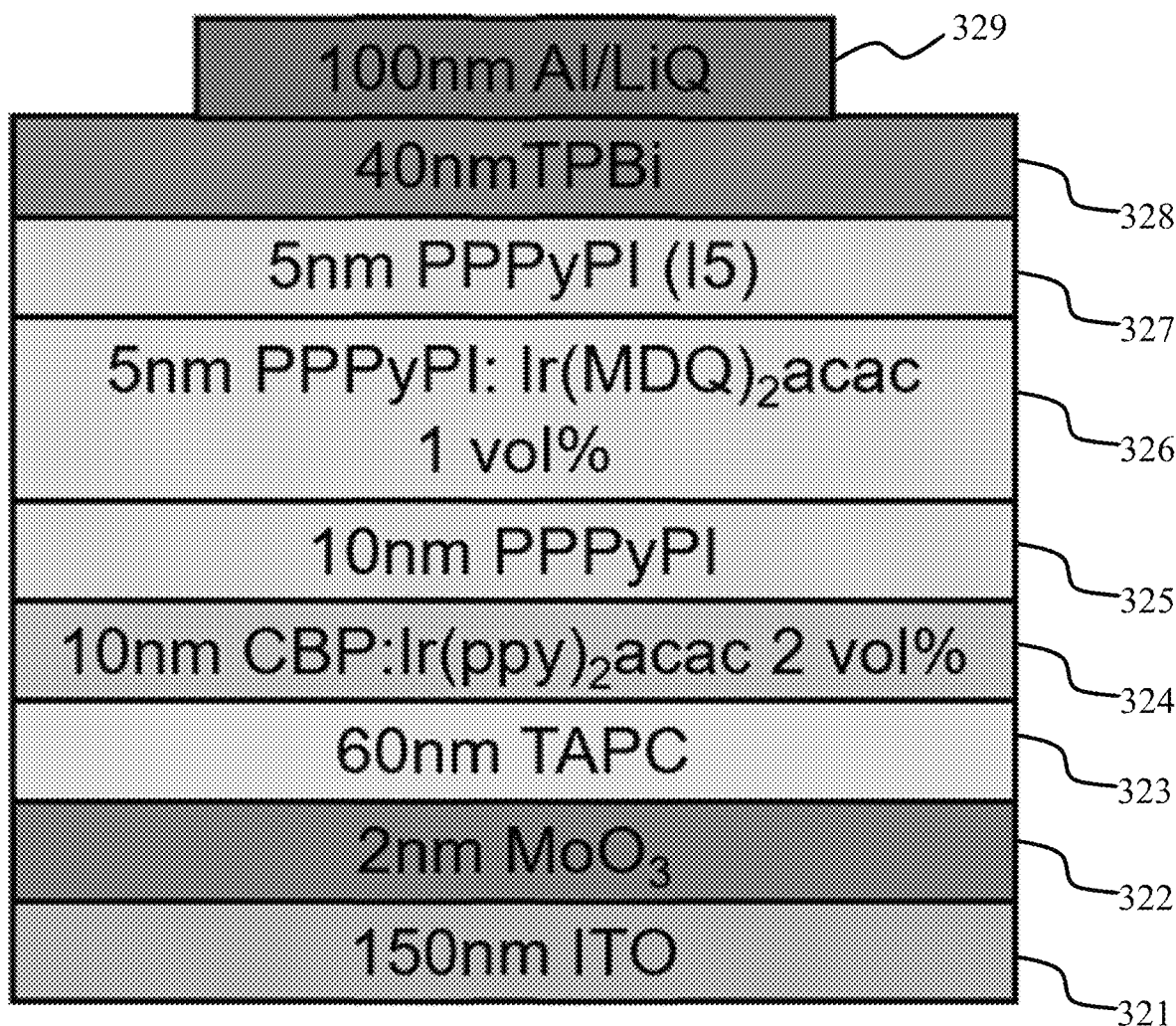
FIG. 3B is an exemplary organic light emitting device.
Figure 3C:
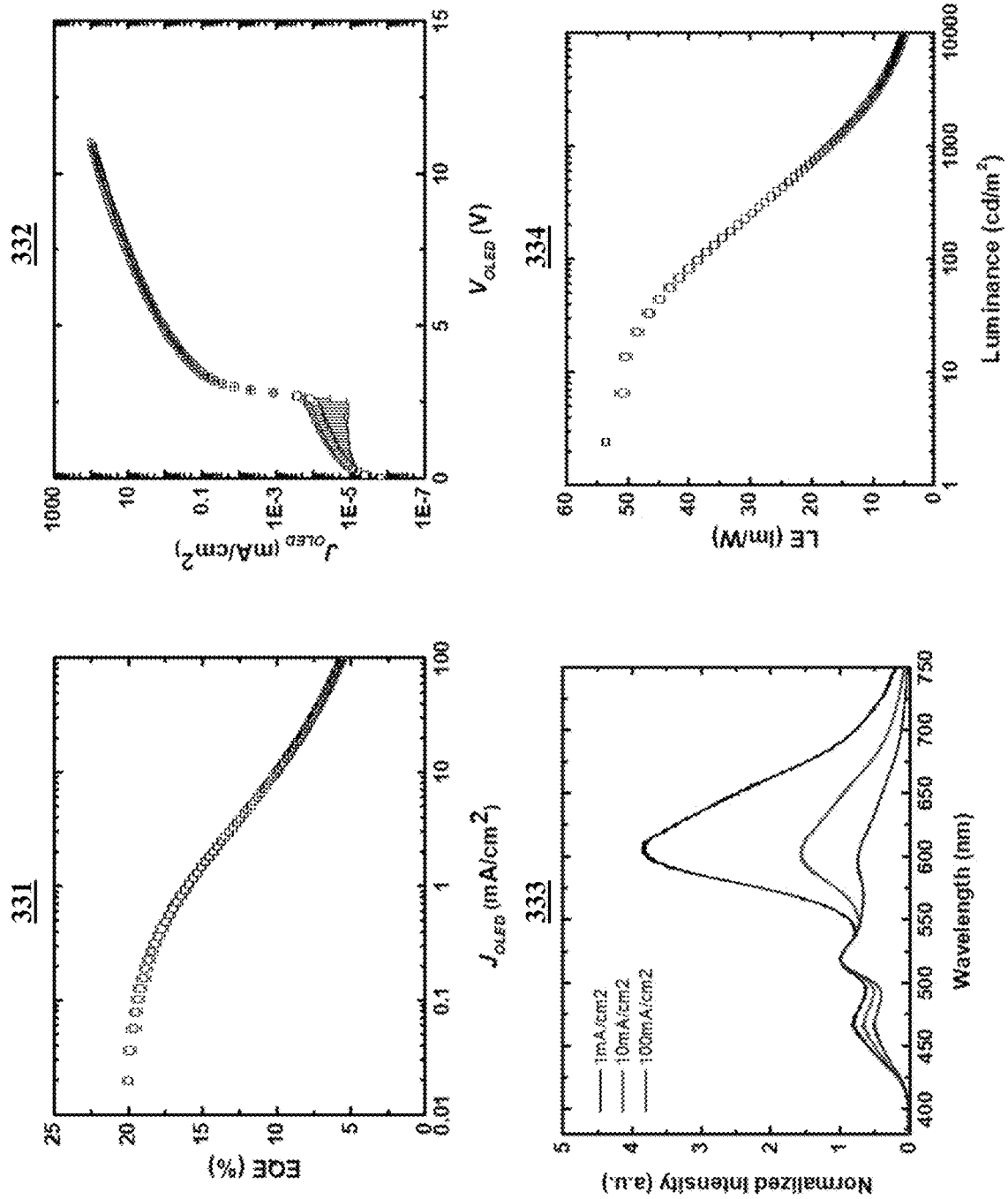
FIG. 3C is a set of graphs of experimental data.

Another exemplary device is shown in FIG. 3B. The depicted device is similar to a device described by Schwartz, et al (Schwartz, et al., High-efficiency white organic-light emitting diodes combining fluorescent and phosphorescent emitter systems. 61920Q (2006), incorporated herein by reference), except that the blue fluorescent material PPPyPI is used instead of 4P-NPD. The hole mobility of 4PNPD is 4 orders of magnitudes higher than its electron mobility which pins the exciton formation zone to the interface between 4P-NPD (replaced in FIG. 3B by layer 325) and the green extraction layer 324. Because excitons and polarons pile up at that interface, this device structure suffers from extreme efficiency roll-off triplet-triplet annihilation (TTA) and triplet-polaron quenching (TPQ). In the device of FIG. 3B, PPPyPI serves the identical purpose to the 4P-NPD used in the Schwartz device. The hybrid WOLED fabricated using PPPyPI shows similar roll-off behavior to the device created by Schwartz, as can be seen in the graphs shown in FIG. 3C. The graphs of FIG. 3C include graph 331, which shows an EQE curve of the PPPyPI hybrid WOLED of FIG. 3B, graph 332 which shows the J-V curve of the PPPyPI hybrid WOLED of FIG. 3B, graph 333, which shows a graph of spectra of the PPPyPI hybrid WOLED of FIG. 3B. The maximum CRI of 90 is obtained at 10 mA/cm$^2$ at a CCT of 3170. Graph 334 shows a Power efficiency curve of the PPPyPI hybrid WOLED of FIG. 3B. The maximum efficiency is 53.61 m/W. Because WOLEDs used for lighting require high luminance, the extreme roll-off must be resolved for the device to have practical value. To relieve the roll-off, the exciton formation profile and polaron profile must be spread out to reduce TTA and TPQ.

One way to improve the device of FIG. 3B is to spread the exciton formation zone. In one embodiment, shown in FIG. 4A, layers 403, 404, and 405 of device 400 are replaced with a single graded layer 413 in device 410, wherein CBP is graded into the emission layer 413 which otherwise consists solely of PPPyPI. The ratio of PPPyPI at the anode side begins from 20% and is linearly increased to 100% at the cathode side. CBP composition starts from 80% at the anode side and is decreased to 0%. The doping concentration of the green emission layer 414 increased in order to promote Forster transfer of interface triplets to Ir(ppy)$_2$acac. A diagram of an exemplary linear graded layer is shown in FIG. 4B, which depicts the ratio of PPPyPI increasing from 20% to 100%, while the CBP concentration decreases from 80% to 0%.

The graded layer 413 in device 410 has a thickness of 25 nm, but a graded layer may have any suitable thickness, for example in a range between 1 nm and 200 nm, or between 5 nm and 100 nm, or between 10 nm and 50 nm, or between 20 nm and 30 nm.

Experimental Examples

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Initial Demonstration

Figure 4A:
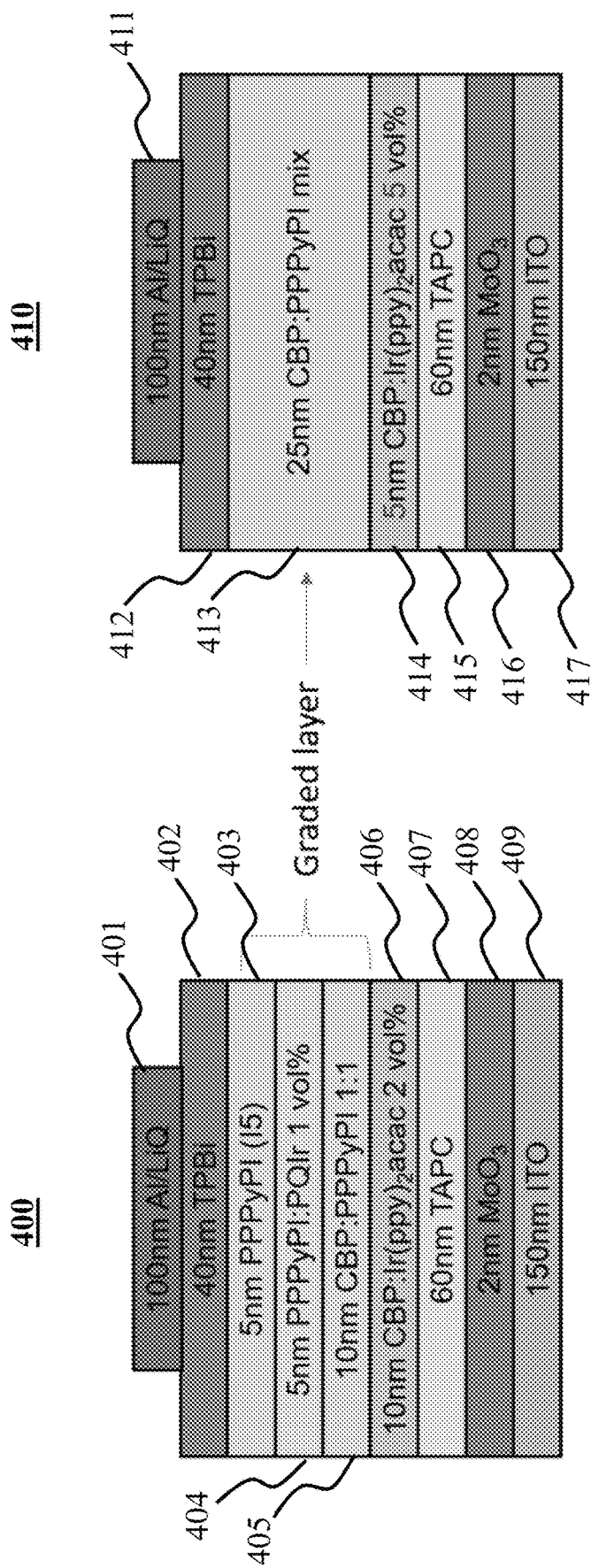
FIG. 4A is a diagram of an organic light emitting device and an organic light emitting device with a graded layer.
Figure 4B:
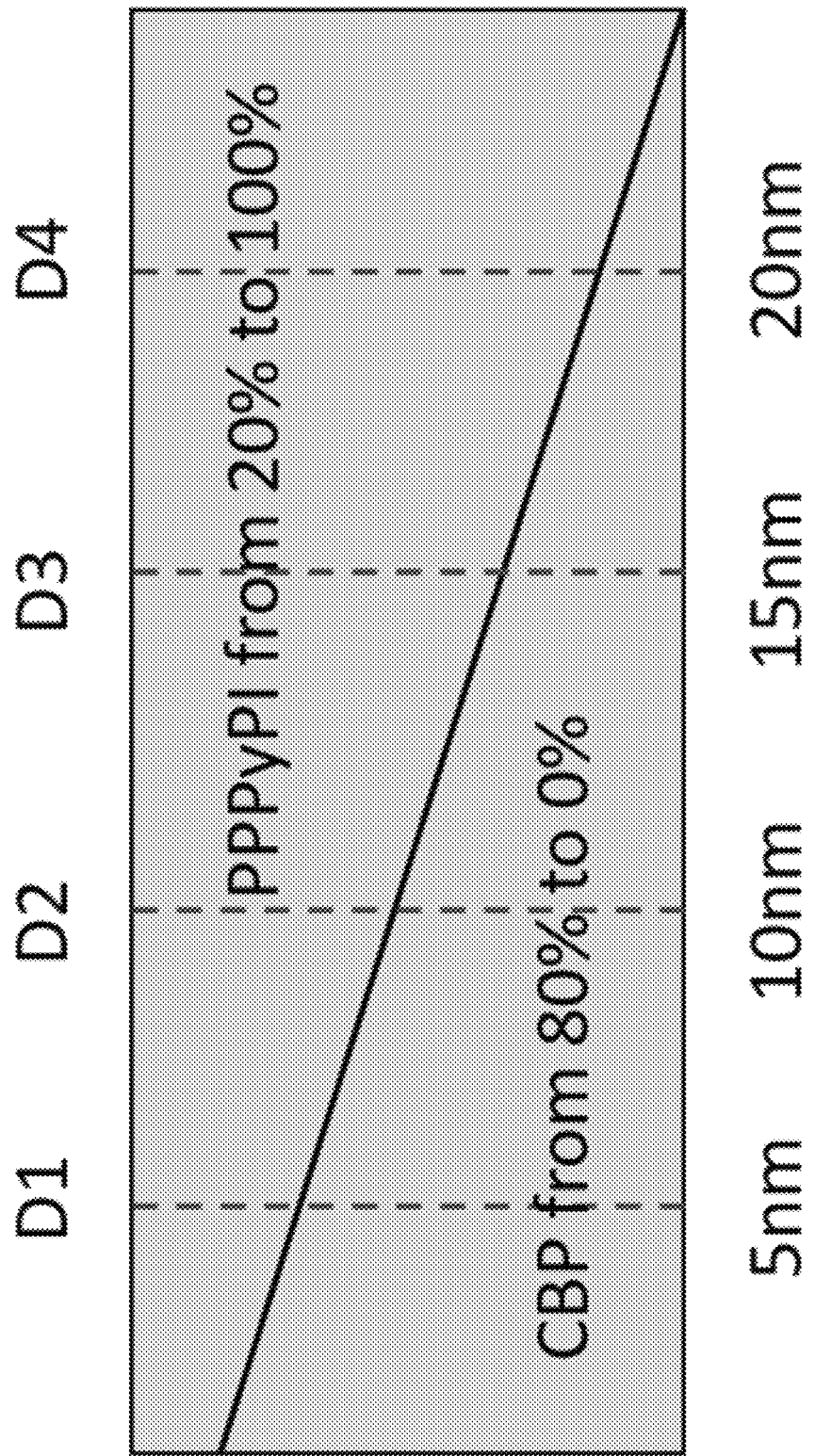
FIG. 4B is a diagram of material concentrations in an exemplary graded layer.
Figure 4C:
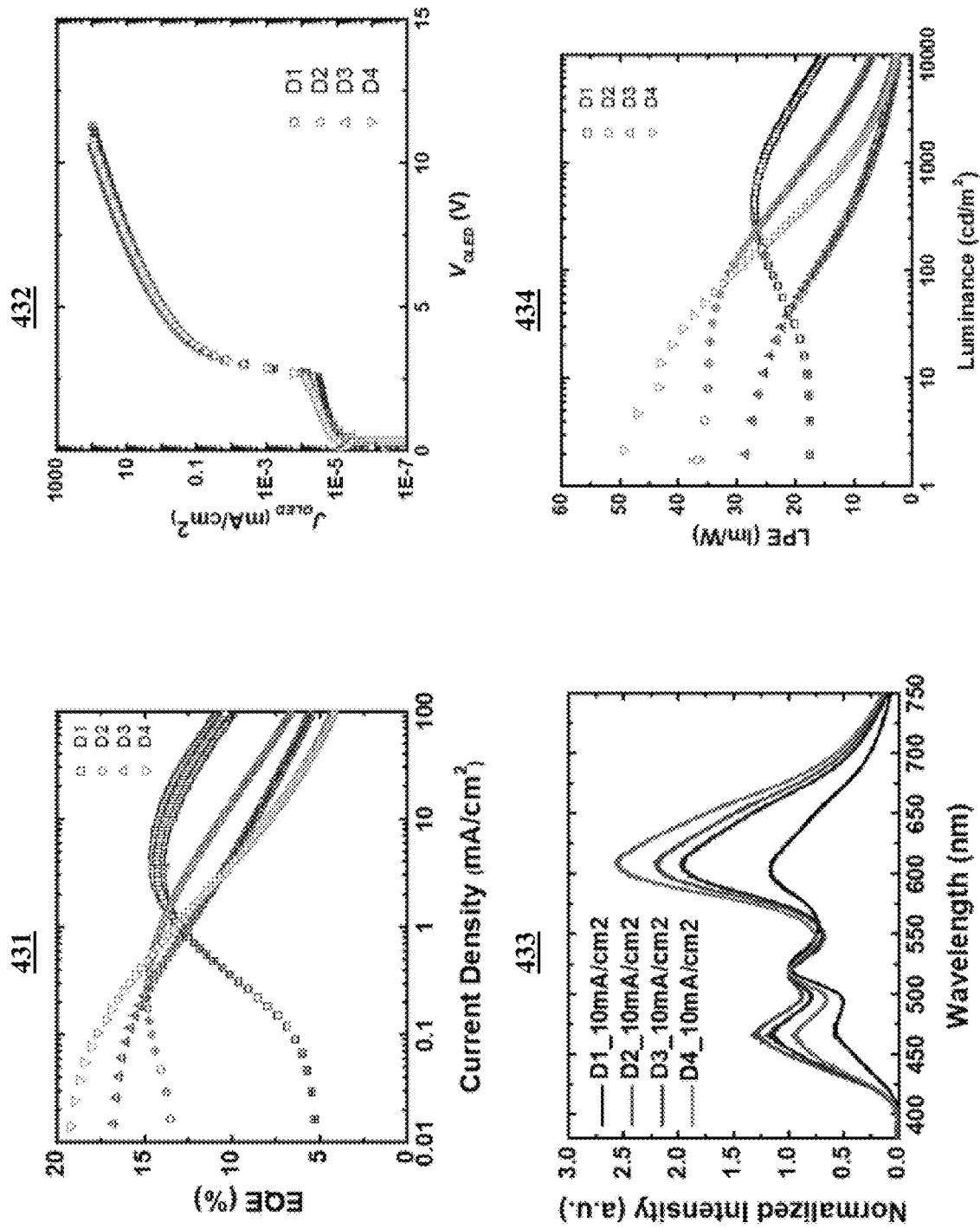
FIG. 4C is a set of graphs of experimental data.

Four devices were tested using the following structure, depicted generally in FIGS. 4A (device 410) and 4B. 0.05 nm of Ir(MDQ)$_2$acac was placed 5 nm, 10 nm, 15 nm, and 20 nm away from the interface between the emission layer 413 and green extraction layer 414 in the graded emission layer as shown in FIG. 4B. The lines D1-D4 indicate the delta doping positions of devices D1-D4. The performance of each device was summarized in FIG. 4C. FIG. 4C shows four graphs, with graph 431 depicting the EQE curve of graded EML hybrid WOLEDs, graph 432 depicting the J-V curve of graded EML hybrid WOLEDs graph 433 depicting the spectra of graded EML hybrid WOLEDs at current density of 10 mA/cm$^2$. The CCT are 3716, 2854, 3009, 2442 and the CRI are 93, 74.6, 78, 80, respectively. Graph 434 shows the power efficiency curve of the graded EML hybrid WOLEDs.

The four devices showed nearly identical JV characteristics indicating almost no contribution of the red sensors. The EQE of the four devices showed strikingly different behavior. D3 and D4 have similar EQE curves with the original device shown in FIG. 3B, indicating that the device was still dominated by quenching due to two particle annihilation processes at high current densities. D1 and D2 showed EQE peaks at higher currents (see graph 431) which shows that it was less affected by TTA and TPQ compared to D3 and D4. The peak EQE of D1 and D2 was 5% lower compared to the original device as well as D3 and D4. The power efficiency of D1 and D2, however, was higher than D3 and D4 at higher luminance. The device structure had many degrees of freedom such as controlling red doping and the grading ratios. The fact that the peak EQE was only 15% shows that there is room for further improvement.

Second Demonstration—Fabrication

Devices according to FIG. 3A were grown on glass substrates with pre-patterned, solvent-cleaned, 1 mm wide indium tin oxide (ITO) anodes strips followed by 20 min of UV-ozone treatment. Films were grown by vacuum thermal evaporation in a chamber with a base pressure of $2 \times 10^{-7}$ torr. The device area was defined by the 2 mm$^2$ intersection of the 2 nm wide Al cathode strips deposited through a shadow mask, and prepatterned ITO strips. A parameter analyzer (Hewlett-Packard, HP4145) and a calibrated Si-photodiode (Thorlabs, FDS1010-CAL) were used to measure current density-voltage-luminance (J-V-L) characteristics of the WOLEDs following standard procedures as described in Forrest, et al., Measuring the Efficiency of Organic Light-Emitting Devices. *Adv. Mater.* 15, 1043-1048 (2003), incorporated herein by reference. The emission spectra of devices were measured using a calibrated spectrometer (Ocean Optics, USB4000) at current densities of 1, 10, 100 mA/cm$^2$.

Here, I5 was used as a neat fluorescent blue emitter as well as a host for Ir(MDQ)$_2$acac. A mixture of phenanthrene-9,10-dione (2.00 g, 9.61 mmol), aniline (1.07 g 11.53 mmol), 4-(pyridin-4-yl)benzaldehyde (1.76 g, 9.61 mmol) and ammonium acetate (1.48 g, 19.21 mmol) in glacial acetic acid (70 mL) was refluxed for 3 h. The precipitate was filtered and washed with aqueous NaOH deionized water. The residue was dried and sublimed at 270° C. and $1.2 \times 10^{-6}$ torr to give pure product. White solid (3.65 g, 8.15 mmol, 85%): 1H NMR (400 MHz, Acetone-d6) δ 8.95-8.89 (m, 1H), 8.87 (ddt, J=8.2, 1.2, 0.6 Hz, 1H), 8.82 (ddd, J=7.9, 1.5, 0.6 Hz, 1H), 8.68-8.62 (m, 2H), 7.85-7.74 (m, 10H), 7.71-7.66 (m, 3H), 7.57 (ddd, J=8.3, 7.0, 1.3 Hz, 1H), 7.33 (ddd, J=8.2, 7.0, 1.2 Hz, 1H), 7.22 (ddd, J=8.3, 1.4, 0.6 Hz, 1H. HRMS calculated for $C_{32}H_{21}N_3$[M+2H]+447.1736, found 449.0914.

Figure 5B:
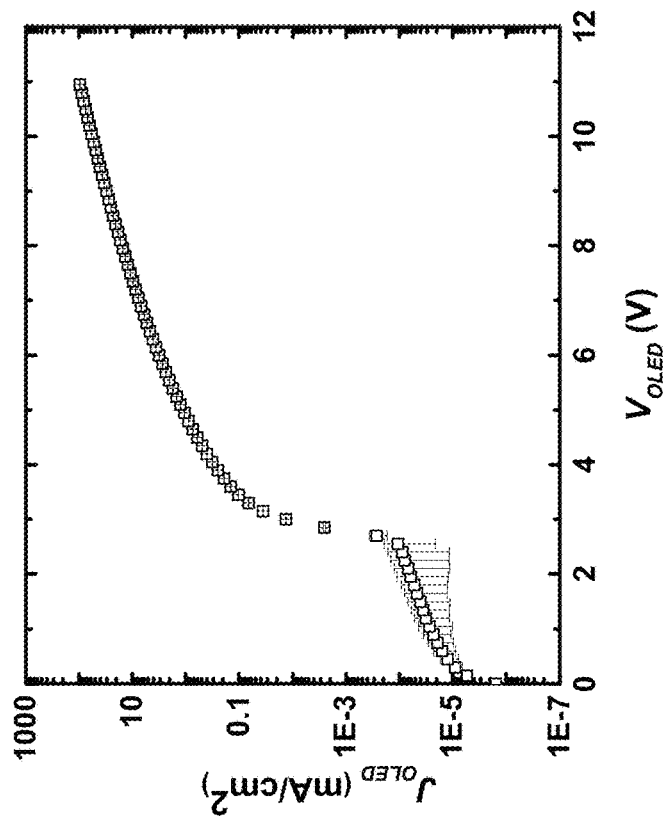
FIG. 5B is a graph of current density vs. voltage.
Figure 5A:
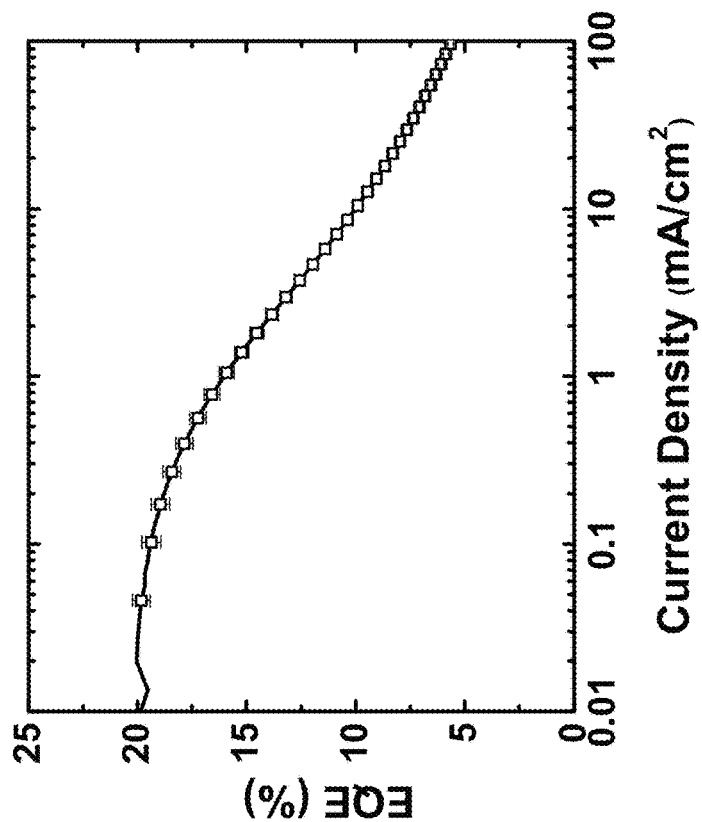
FIG. 5A is a graph of EQE vs. current density.
Figure 5D:
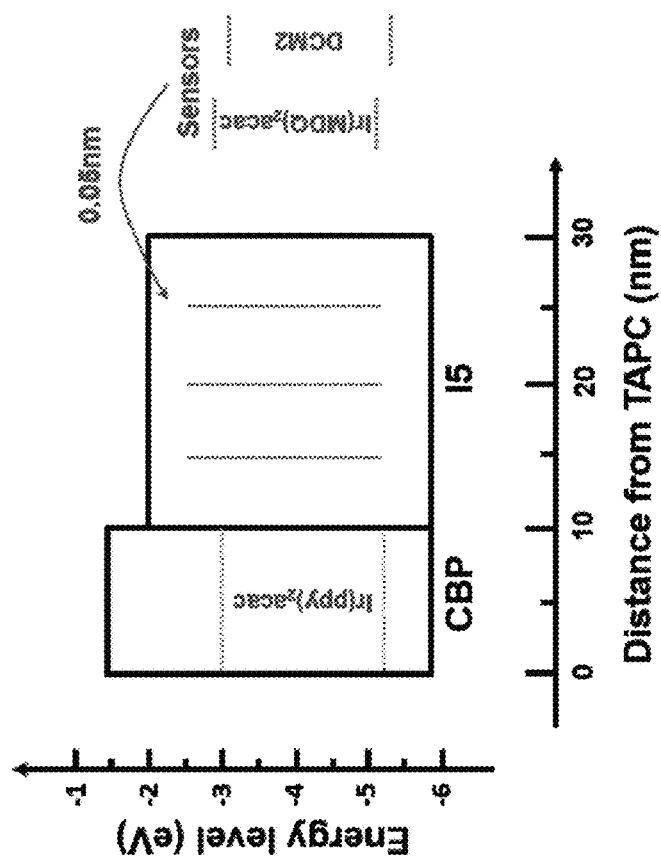
FIG. 5D is a chart of frontier orbital energies and thickness of an emissive layer.
Figure 5C:
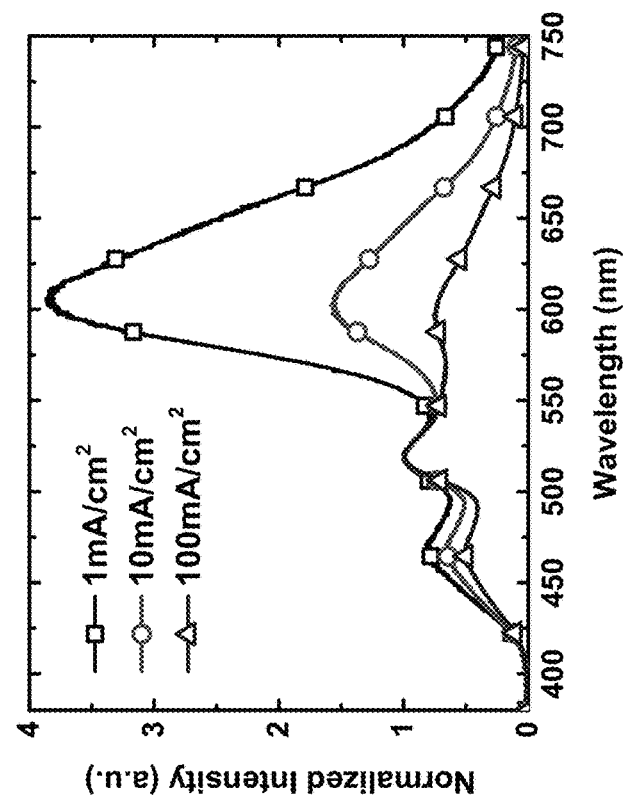
FIG. 5C is a graph of spectra measured at various current densities.

Since I5 cannot be used to host Ir(ppy)$_2$acac due to its triplet energy of 2.38 eV, the green phosphor was doped in CBP which was placed adjacent to the blue emissive layer. All excitons generated in the CBP are thus used for green emission. The exciton formation zone of the hybrid WOLED was at the interface between the green emissive layer 304 and the blue emissive layer 305 since I5 transports electrons. With this structure, the device achieved a peak quantum efficiency of 20.0±0.3%, a color rendering index of CRI=90 and correlated color temperature of CCT=3470K at a current density of 10 mA/cm$^2$, see FIG. 5A and FIG. 5B. FIG. 5A shows a graph of EQE versus current density, while FIG. 5B shows a graph of current density vs. voltage. FIG. 5C shows a graph of spectra measured at current densities of 1, 10, and 100 mA/cm$^2$. FIG. 5D shows a chart of frontier orbital energies and thickness of the EML. The x-axis represents the distance from the TAPC/CBP:Ir(ppy)$_2$acac interface. Sensors were placed 5 nm apart starting from 0 nm in the devices for exciton profiling.

As shown in FIG. 5A, the external quantum efficiency (EQE) roll-off with increasing current was severe. Thus, EQE was reduced to half of its value at low current of 9.68±0.06 mA/cm$^2$, an order of magnitude lower compared to a typical Ir(ppy)$_3$ based OLED.

Exciton Density Measurement

Figure 6:
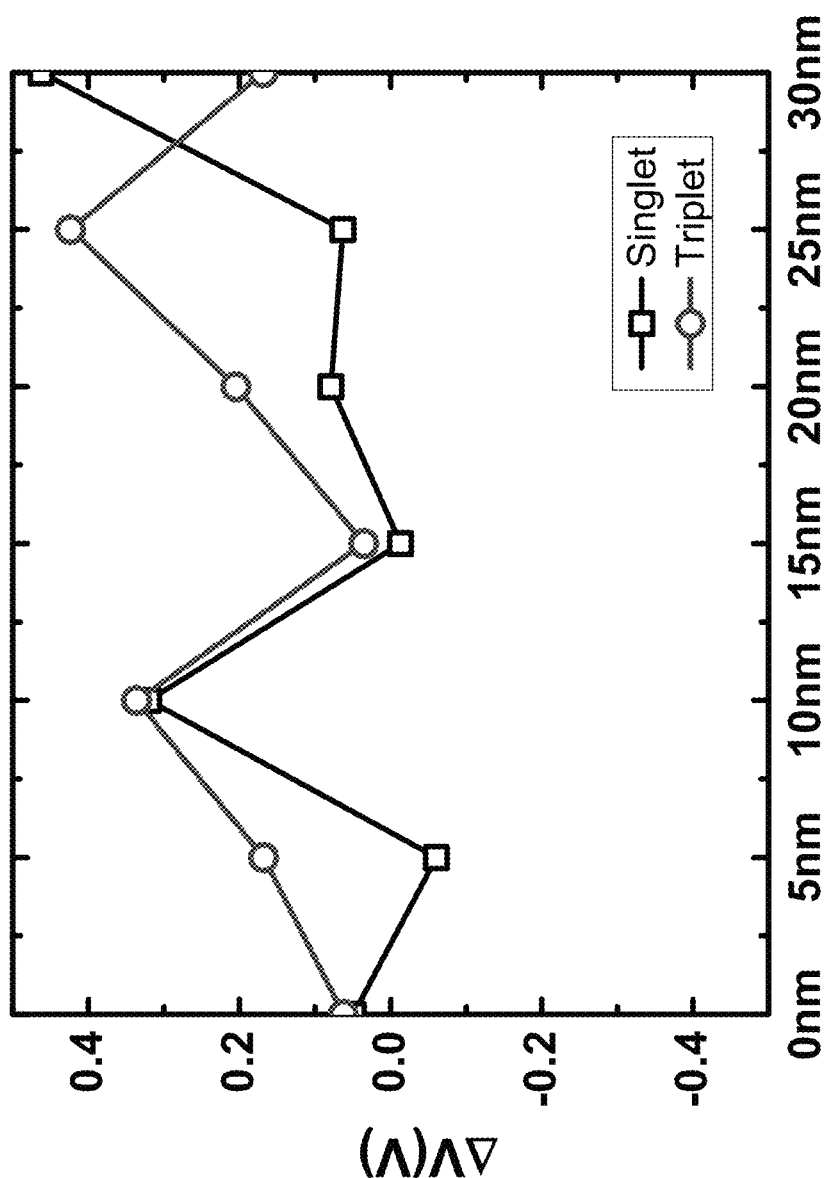
FIG. 6 is a graph of voltages of sensing devices across sensor position.

The drastic roll-off in efficiency was due to triplet-triplet and triplet-polaron annihilation (see Giebink et al., Quantum efficiency roll-off at high brightness in fluorescent and phosphorescent organic light emitting diodes. *Phys. Rev. B—Condens. Matter Mater. Phys.* 77, 1-9 (2008), incorporated herein by reference) originating from imbalanced charge mobility of the host that causes a pile-up of both excitons and polarons at one edge of the EML. To determine the spatial distribution of excitons within the EML, ultrathin 0.5 Å layers of red dopants, i.e. sensor layers, were inserted at several different positions in a series of otherwise identical devices. These sensor layers were delta-doped, i.e. they resembled a delta function of dopants embedded within the host. In particular, seven devices were fabricated with sensor layers spaced at 5 nm intervals from 0 nm to 30 nm as shown in FIG. 3E. An eighth control device with no sensor deposition was also fabricated for both cases. The delta-doped layers had minimal impact on the J-V characteristics when compared to the control device. As shown in FIG. 6, the graph shows two plots of voltage of sensing devices subtracted from a control device at J=10 mA/cm$^2$. The voltage variance does not follow a trend and is independent of sensor position showing that sensors do not have a critical effect on the electrostatics of the device.

The 5 nm thick I5 layer doped with 1 vol % Ir(MDQ)$_2$acac in the device in FIG. 3A was replaced with a neat layer of I5 when fabricating devices for exciton profiling. To sense both singlets and triplets, sensors with lower singlet and triplet energies were compared to the hosts. Thus the intensity of sensor emission was directly proportional to the exciton density at each position. Ir(ppy)$_2$acac had the lowest triplet energy of 2.37 eV in the device. Then, 4-(dicyanomethylene)-2-methyl-6-julolidyl-9-enyl-4H-pyran (DCM2) was used as a fluorescent, singlet sensor with singlet energy of 2.05 eV, and Ir(MDQ)$_2$acac was the triplet sensor with triplet energy of 2.01 eV.

Figure 7:
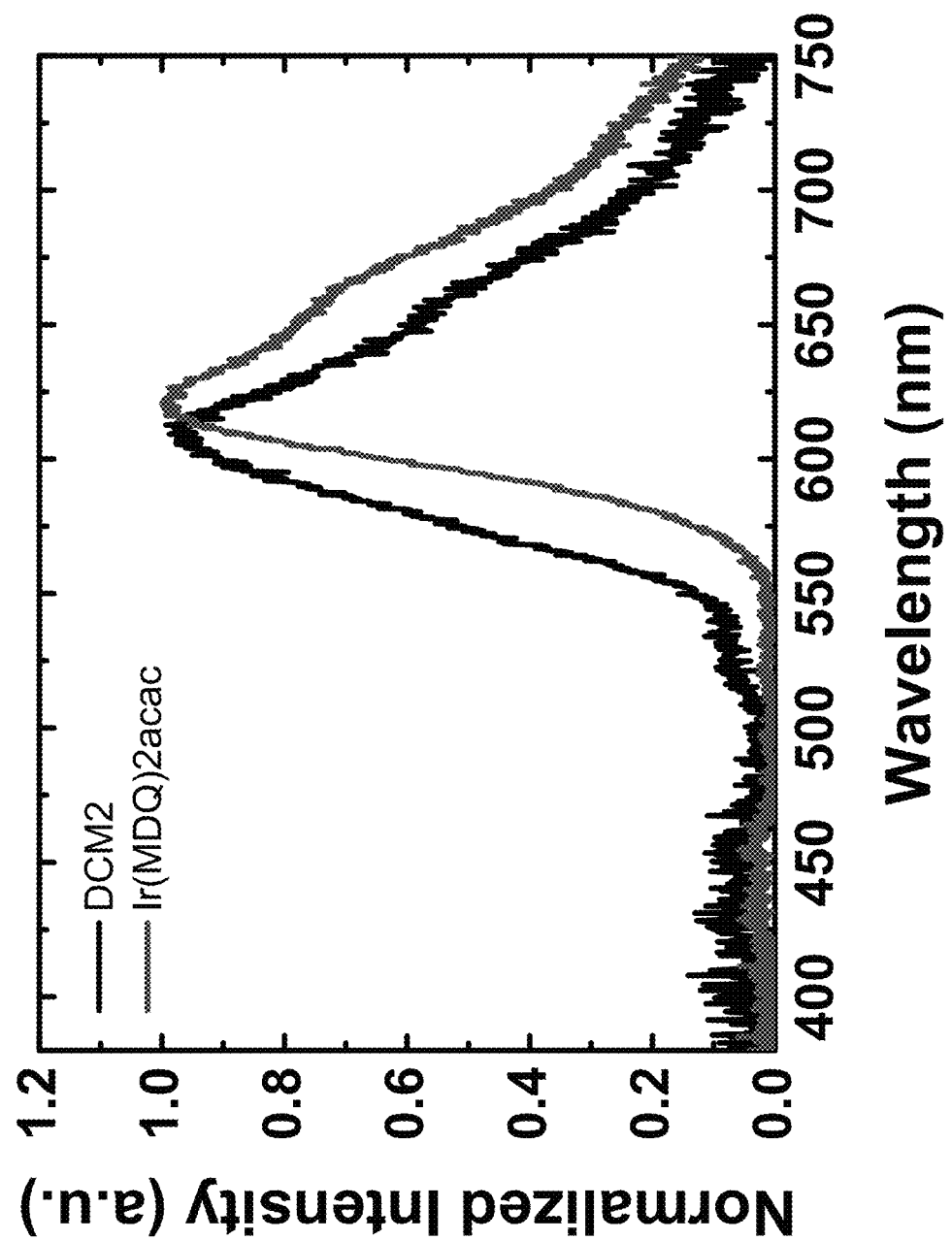
FIG. 7 is a graph of photoluminescence spectra.

The exciton density at each position was calculated using the J-V-L characteristics and emission spectra of devices with sensing layers. First, the green emission was subtracted from the OLED spectrum using the emission from a conventional Ir(ppy)$_2$acac device. This gave a clear spectral separation between the emission of I5 and the sensor, allowing for an accurate calculation of the relative emission intensities of I5, Ir(ppy)$_2$acac, and the sensor. The relative emission intensities, combined with external quantum and outcoupling efficiencies and the photoluminescence quantum yield (PLQY) at each position were used to calculate the exciton density profile using a previous analysis (see Lee, J. et al. Hot excited state management for long-lived blue phosphorescent organic light-emitting diodes. *Nat. Commun.* 8, 1-9 (2017), incorporated herein by reference). (see also FIG. 7).

One distinction between the disclosed device and prior work is that the disclosed device is not monochromatic. Thus, the WOLED structure required a more complicated analysis than conventional monochromatic OLEDs since the triplet density within the Ir(ppy)$_2$acac doped CBP layer could be overestimated when using the method of Lee et al. Specifically, to account for quenching of Ir(ppy)$_2$acac emission due to the presence of Ir(MDQ)$_2$acac, PL measurements were carried out with CBP films doped with 2 vol % Ir(ppy)$_2$acac and 5 vol % Ir(MDQ)$_2$acac. The spectra of the CBP:Ir(ppy)$_2$acac:Ir(MDQ)$_2$acac film showed no trace of Ir(ppy)$_2$acac emission (see FIG. 7). The 90.2% PLQY is comparable to that of 5 vol % Ir(MDQ)$_2$acac doped in CBP. This tended to indicate nearly complete triplet transfer from Ir(ppy)$_2$acac to Ir(MDQ)$_2$acac from which the local triplet density in the CBP:Ir(ppy)$_2$acac layer could be inferred from the loss of green emission. Phosphor sensitized fluorescence also overestimates the singlets density as Ir(ppy)$_2$acac triplets can transfer to DCM2. Therefore, results from a previous study were used where the transfer from Ir(ppy)$_3$ to DCM2 was found to be 80% in a CBP:Ir(ppy)$_3$:DCM2 device (see D'Andrade, B. W. et al. High-efficiency yellow double-doped organic light-emitting devices based on phosphor-sensitized fluorescence. *Appl. Phys. Lett.* 79, 1045-1047 (2001), incorporated herein by reference).

Figure 8B:
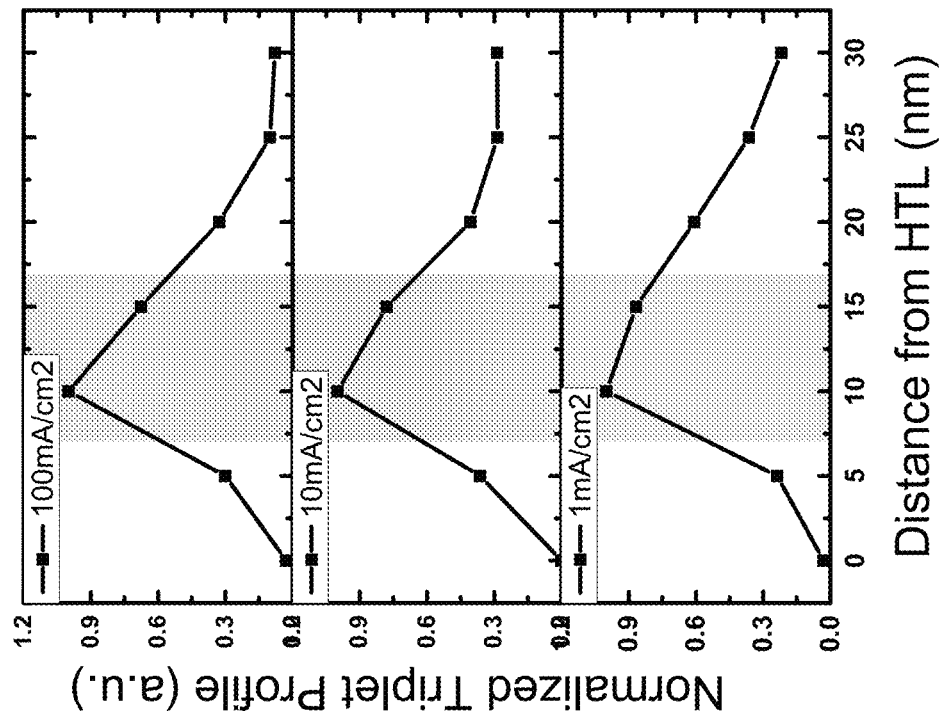
FIG. 8B is a set of graphs of normalized triplet profiles for various current densities.
Figure 8A:
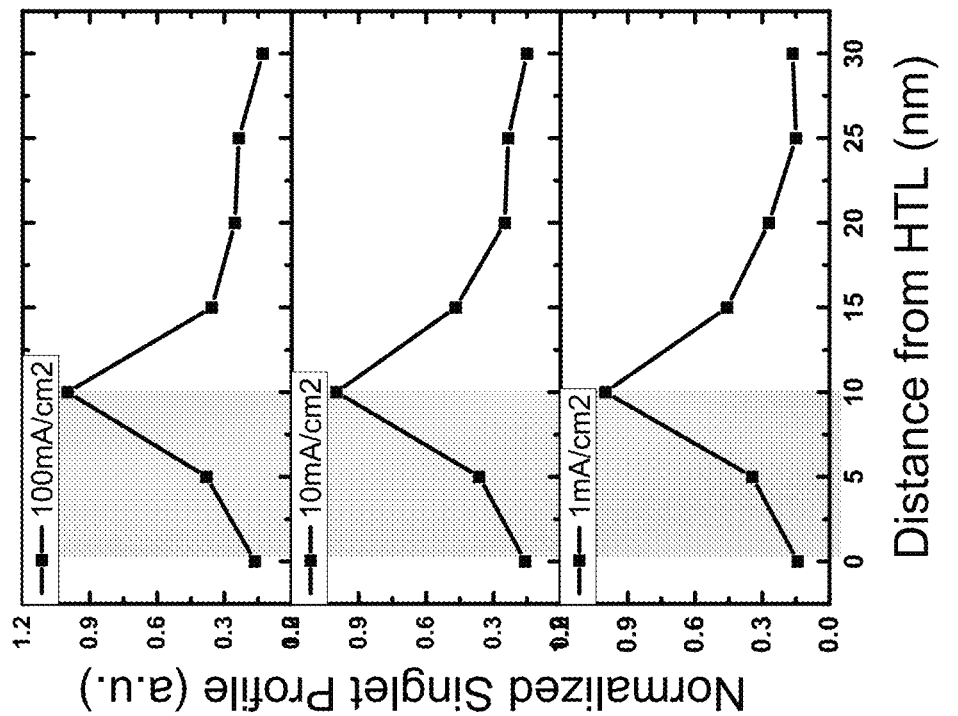
FIG. 8A is a set of graphs of normalized singlet profiles for various current densities.

The resulting exciton profiles of the hybrid WOLED are shown in FIGS. 8A and 8B. FIG. 8A shows a normalized singlet profile of a neat I5 hybrid WOLED at current densities of 1, 10, 100 mA/cm$^2$. The green shaded area indicates the CBP:Ir(ppy)$_2$acac region. FIG. 8B shows a graph of the normalized triplet profile. Singlets and triplets were generated simultaneously upon electrical injection within the emission zone and subsequently diffused, where triplets had the longer diffusion length. The peak exciton generation was at the CBP:Ir(ppy)$_2$acac/I5 interface (310, see FIG. 3A) for both singlets and triplets, confirming that I5 is electron transporting. Because excitons and electrons were confined to an interface, bimolecular annihilation became significant at lower current densities compared to conventional phosphorescent OLEDs, explaining the steep EQE roll-off with increasing current density of the disclosed device.

It has been shown that grading the doping ratio of phosphors across the EML is effective in reducing the local concentrations of both excitons and polarons. (see Zhang, Y., et al., Tenfold increase in the lifetime of blue phosphorescent organic light-emitting diodes. *Nat. Commun.* 5, 5008 (2014), incorporated herein by reference) Hence, in one embodiment of the disclosed device, the electron transporting I5 and the hole transporting CBP were graded across a co-doped EML, with the compositions specified in FIG. 9A. That is, I5 was linearly graded from 10 vol % to 90 vol %, and CBP graded from 90 vol % to 10 vol % from the anode to the cathode side. Other layers remained identical to the device discussed above. The graph in FIG. 9A shows a device structure and frontier orbital energies of graded EML materials, CBP and I5. In the depicted graph, the energy level is shown on the y-axis. The x-axis in FIG. 9A may be referred to as the "gradient axis." Compositions of CBP and I5 at each end are shown, and in the depicted embodiment both materials were linearly graded from one end to the other. Electrons were transported by I5 and holes were transported by CBP. The lowest unoccupied molecular orbital (LUMO) of I5 is 2.0 eV which is lower than that of CBP at 1.5 eV, suggesting that electrons were transported through I5 within the graded EML. The highest occupied molecular orbital (HOMO) of the two materials were identical at 5.9 eV, but measurements showed that holes were transported through CBP when the two materials were mixed. The exciton formation zone was therefore no longer confined to the CBP/I5 interface.

Figure 9B:
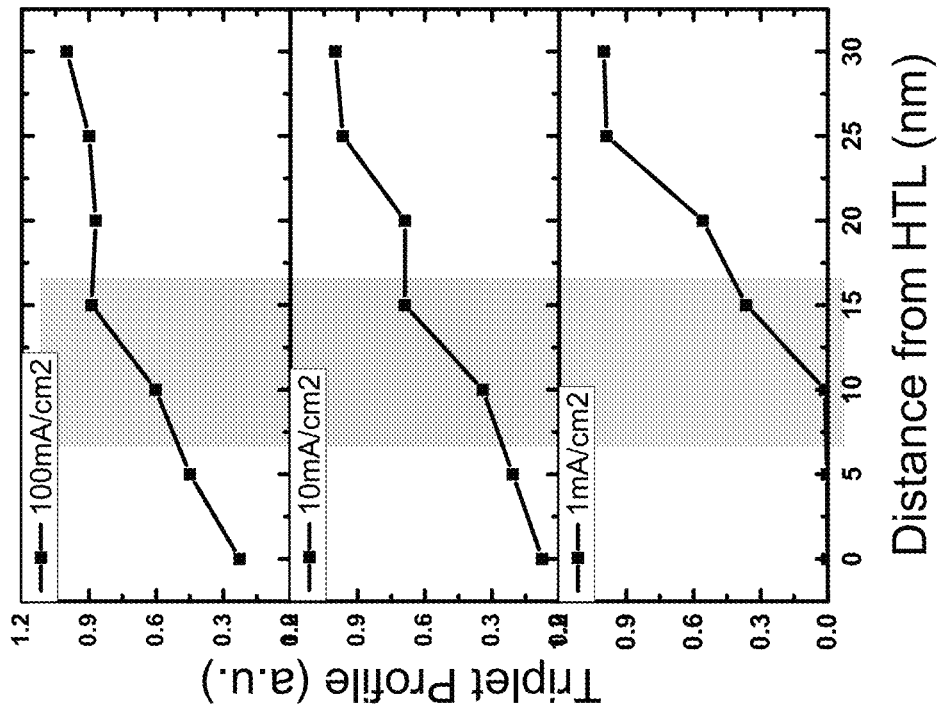
FIG. 9B is a set of graphs of normalized singlet profiles for various current densities.
Figure 9C:
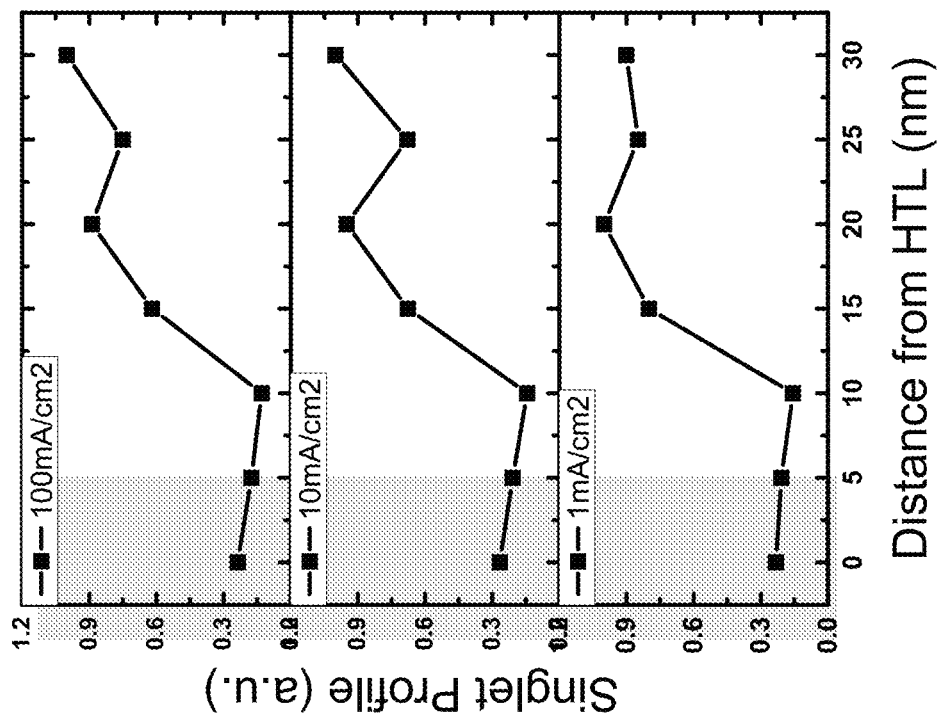
FIG. 9C is a set of graphs of normalized triplet profiles for various current densities.
Figure 10B:
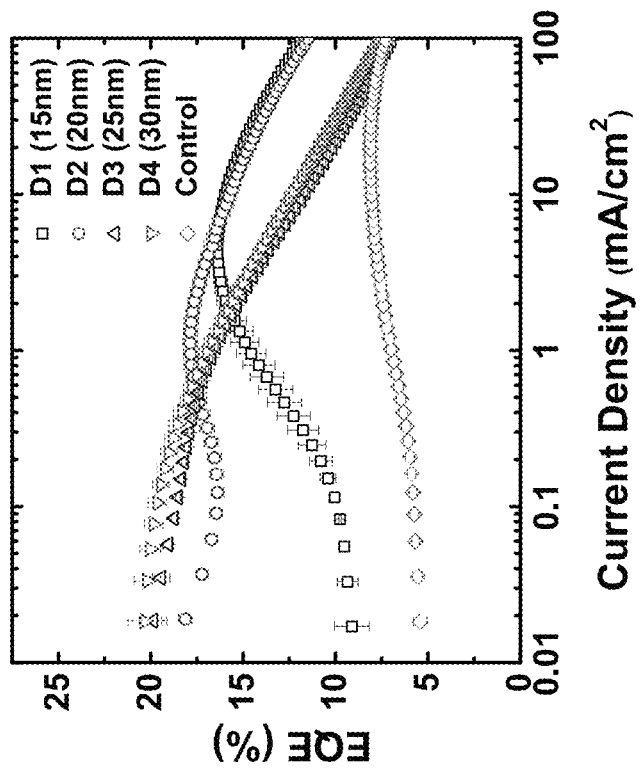
FIG. 10B is a graph of EQE for various devices across a range of current densities.
Figure 10A:
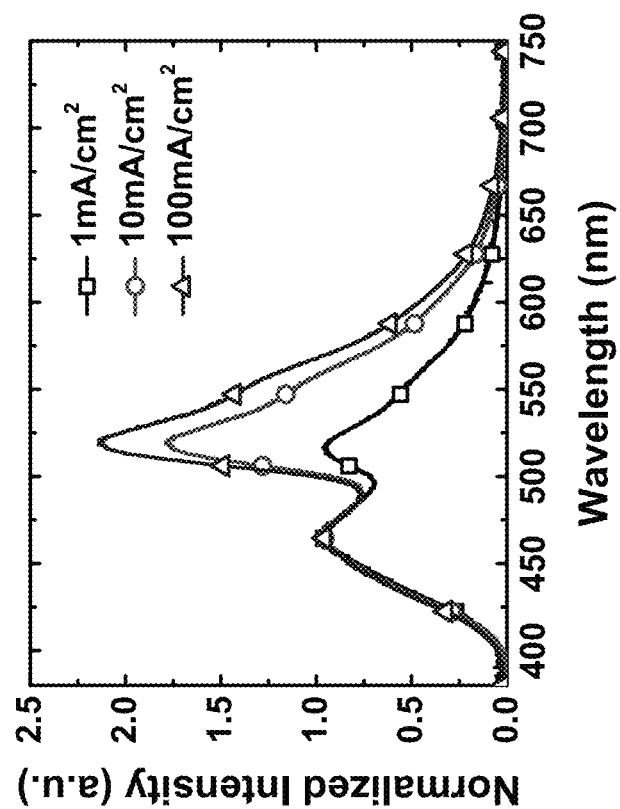
FIG. 10A is a graph of spectra measured at various current densities.

FIG. 9B shows the measured singlet profile of the graded EML device 410 at current densities of 1, 10, 100 mA/cm$^2$. The singlet concentration had a maximum at the interface between TPBi layer 412 and the graded EML layer 413. More importantly, the density was relatively flat across the EML compared to the device with neat I5. Unlike the observation of almost no singlets between 0 to 10 nm, the measured triplet distribution in FIG. 9C shows evidence for triplets in this region. Hence, it was inferred that green emission results from triplet diffusion and not direct exciton generation on the Ir(ppy)$_2$acac. The increasing density of triplets with current density in the CBP layer was supported by the spectra and EQE of a control device shown in FIGS. 10A and 10B, respectively. FIG. 10A shows a graph of spectra of the control device with no sensors obtained at current densities of 1, 10, 100 mA/cm$^2$. FIG. 10B shows a graph of EQE versus current for four devices with Ir(MDQ)$_2$acac sensors at 15 nm to 30 nm in 5 nm intervals and the control device. In summary, both singlets and triplets were more evenly distributed between 10 nm and 30 nm compared to the ungraded device due to a better balance of the electron and hole mobilities.

Results

Based on the foregoing, four devices were fabricated with delta-doped Ir(MDQ)$_2$acac layers at 15 nm, 20 nm, 25 nm, and 30 nm, labelled D1, D2, D3, and D4, respectively. The EQE of the devices are shown in FIG. 10B, with the detailed device performance characteristics at a current density of 10 mA/cm$^2$ summarized in Table 1 below. Placement of the sensor farther from the ETL was correlated with an efficiency peak at higher current density. Additionally, the maximum EQE of all devices was >15%, showing that only a 0.05 nm layer of the red emitting phosphor was sufficient to capture almost all diffusing triplets. The efficiencies of D3 and D4 peaked at the lowest current density, and exhibited a decrease at high current similar to the device with a neat EML, indicating that they still suffered from annihilation. In contrast, D1 and D2 had a lower peak efficiency but a reduced tendency to roll-off at high currents.

TABLE 1

| Device | EQE | CIE | CCT | CRI |
| --- | --- | --- | --- | --- |
| D1 | 15.9 ± 0.04% | (0.42, 0.34) | 2662K | 74 |
| D2 | 15.7 ± 0.38% | (0.41, 0.36) | 3133K | 82 |
| D3 | 11.7 ± 0.1% | (0.48, 0.41) | 2501K | 89 |
| D4 | 12.35 ± 0.19% | (0.48, 0.44) | 2658K | 91 |

FIG. 11A, FIG. 11B, and FIG. 11C show the unnormalized spectra of D2 and the control device at current densities of 1 mA/cm$^2$ (FIG. 11A), 10 mA/cm$^2$ (FIG. 11B), and 100 mA/cm$^2$ (FIG. 11C). At lower current densities of 1-10 mA/cm$^2$, a reduction of green emission was observed, which recovered at 100 mA/cm$^2$. This indicates that the delta doped phosphor can harvest diffusing triplets without saturating at low current densities, yielding a peak of EQE=20% for D4. Green emission was reduced because the red dopant harvested diffusing triplets that would otherwise have reached the green phosphor. The PLQY average of 88% with 5 vol % Ir(MDQ)$_2$acac doped into a graded EML measured at the five sensor positions indicate that 0.05 nm thick delta doped layers are free of concentration quenching, as shown in Table 2 below. Table 2 shows measured PLQY of films corresponding to the material compositions of seven positions used for sensing for the graded EML device.

TABLE 2

| Sensor position | Sensor | PLQY |
| --- | --- | --- |
| 0 nm | DCM2 | 59% |
| | Ir(MDQ)$_2$acac | 90.2% |
| 5 nm | DCM2 | 59% |
| | Ir(MDQ)$_2$acac | 90.2% |
| 10 nm | DCM2 | 64.5% |
| | Ir(MDQ)$_2$acac | 89.3% |
| 15 nm | DCM2 | 62.1% |
| | Ir(MDQ)$_2$acac | 90.2% |
| 20 nm | DCM2 | 64% |
| | Ir(MDQ)$_2$acac | 87.9% |
| 25 nm | DCM2 | 60.3% |
| | Ir(MDQ)$_2$acac | 84.8% |
| 30 nm | DCM2 | 57% |
| | Ir(MDQ)$_2$acac | 88.2% |

Red emission was reduced with increasing current density due to increased triplet-triplet annihilation which was not evident in the control device. However, the roll-off slopes of D1 and D2 were lower than those of D3 and D4. The sensors for D3 and D4 were placed directly at the exciton formation region, therefore red emission from these devices mostly originated from phosphorescence from direct trapping rather than harvesting of diffusing triplets. A similar observation was made in a previous study where the efficiency roll-off was less severe for a hybrid WOLED where the phosphorescence emission zone was placed away from the exciton formation zone, having a lower local equilibrium density of triplets. (see Sun, Y. et al. Management of singlet and triplet excitons for efficient white organic light-emitting devices. *Nature* 440, 908-912 (2006), incorporated herein by reference).

The fact that D1 and D2 had a lower peak EQE when compared to D3, D4, and the ungraded device shows that not all triplets within the EML were harvested. This can be explained as a combined effect of short diffusion length and triplet-triplet annihilation. Improvements can be made to utilize all excitons formed within the device by fine-tuning the grading ratio. Further improvements in power efficiency can be achieved by doping one or more of the transport layers to reduce Ohmic loss.

CONCLUSION

Disclosed herein is a method to reduce quantum efficiency roll-off with increasing current and brightness by grading electron transporting I5 with hole transporting CBP. Ultrathin red sensor layers were employed in the device to map the singlet and triplet density within the device, showing that the roll-off can be managed by spreading the exciton density within the EML. Furthermore, using an ultrathin layer of phosphor that is merely 0.05 nm thick can harvest enough excitons to emit red light to achieve a warm white spectrum suitable for solid-state lighting.

The disclosures of each and every patent, patent application, and publication cited herein are hereby incorporated herein by reference in their entirety. While the devices and methods herein have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

What is claimed is:

1. An OLED device, comprising:
    an anode and a cathode; and
    at least one graded emissive layer disposed between the anode and the cathode, the graded emissive layer comprising first and second materials, wherein a concentration of the first material increases continuously from an anode side of the graded emissive layer to a cathode side of the graded emissive layer and a concentration of the second material decreases continuously from the anode side of the graded emissive layer to the cathode side of the graded emissive layer;
    wherein the first material has a concentration greater than 10% and less than or equal to 30% on the anode side of the graded emissive layer, and a concentration between 70% and 100% on the cathode side of the graded emissive layer; and
    wherein the second material has a concentration greater than or equal to 70% and less than 90% on the anode side of the graded emissive layer and a concentration of between 0% and 30% on the cathode side of the graded emissive layer.

2. The OLED device of claim 1, wherein the first material has a concentration of about 20% on the anode side of the graded emissive layer and a concentration of about 100% on the cathode side of the graded emissive layer; and
    wherein the second material has a concentration of about 80% on the anode side of the graded emissive layer and about 0% on the cathode side of the graded emissive layer.

3. The OLED device of claim 1, further comprising at least one non-graded emissive layer disposed between the anode and the cathode.

4. The OLED device of claim 3, wherein the non-graded emissive layer is disposed between the graded emissive layer and the anode.

5. The OLED device of claim 3, wherein the graded emissive layer is a blue emissive layer and the non-graded emissive layer is selected from the group consisting of a green emissive layer and a red emissive layer.

6. The OLED device of claim 1, wherein the graded emissive layer is a blue emissive layer.

7. The OLED device of claim 1, wherein the OLED device is selected from the group consisting of a white OLED and a hybrid white OLED.

8. The OLED device of claim 7, wherein the graded emissive layer is a blue fluorescent emissive layer, and further comprising red and green phosphorescent emissive layers disposed between the anode and the cathode.

9. The OLED device of claim 1, wherein the concentration of the first material increases according to a mathematical function, and the concentration of the second material decreases according to the mathematical function; and
    wherein the mathematical function is selected from the group consisting of a linear function, a parabolic function, and a logarithmic function.

10. The OLED device of claim 1 wherein at least one of a rate of increasing concentration of the first material and a rate of decreasing concentration of the second material is variable.

11. A product comprising the OLED device of claim 1, the product selected from the group consisting of a flat panel display, a curved display, a computer monitor, a medical monitor, a television, a billboard, a lights for interior or exterior illumination and/or signaling, a heads-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3-D display, a virtual reality display, an augmented reality display, a vehicle, a video wall comprising multiple displays tiled together, a theater or stadium screen, and a sign.

12. An OLED device comprising a graded emissive layer, the graded emissive layer comprising a first material having a first continuous volumetric concentration gradient in a first direction from an anode side to a cathode side of the graded emissive layer, across a thickness of the layer and a second material having a second continuous volumetric concentration gradient opposite the first direction;
    wherein the first continuous volumetric concentration gradient begins at a concentration of greater than 10% and less than or equal to 30%, and increases to a concentration between 70% and 100%; and
    wherein the second continuous volumetric concentration gradient begins at a concentration of between 0% and 30% and increases to a concentration of greater than or equal to 70% and less than 90%.

13. The OLED device of claim 12, wherein the graded emissive layer is a blue emissive layer.

14. The OLED device of claim 12, wherein the OLED device is a white OLED or a hybrid white OLED.

15. The OLED device of claim 6, wherein the graded emissive layer is a blue fluorescent emissive layer, and further comprising red and green phosphorescent emissive layers.

16. The OLED device of claim 12, wherein the first and second continuous volumetric gradients are follow a mathematical function selected from the group of linear, parabolic, logarithmic, or variable.

17. A hybrid white OLED device, comprising:
at least red and green phosphorescent emissive layers disposed between the anode and the cathode; and
at least one blue fluorescent graded emissive layer, the graded emissive layer comprising first and second materials and having first and second surfaces facing the anode and cathode, respectively, wherein a concentration of the first material increases continuously from the first surface of the graded emissive layer to the second surface of the graded emissive layer, and a concentration of the second material decreases continuously from the first surface of the graded emissive layer to the second surface of the graded emissive layer;
wherein the first material has a concentration greater than 10% and less than or equal to 30% on the first surface, and a concentration between 70% and 100% on the second surface; and
wherein the second material has a concentration greater than or equal to 70% and less than 90% on the first surface and a concentration of between 0% and 30% on the second surface.

* * * * *

UNITED STATES PATENT AND TRADEMARK OFFICE
CERTIFICATE OF CORRECTION

PATENT NO. : 11,342,526 B2
APPLICATION NO. : 16/745851
DATED : May 24, 2022
INVENTOR(S) : Stephen R. Forrest et al.

It is certified that error appears in the above-identified patent and that said Letters Patent is hereby corrected as shown below:

In the Claims

Replace Column 21 Lines 5-8 Claim 15 with the below:
15. The OLED device of claim 14, wherein the graded emissive layer is a blue fluorescent emissive layer, and further comprising red and green phosphorescent emissive layers.

Signed and Sealed this
Twenty-third Day of August, 2022

Katherine Kelly Vidal
*Director of the United States Patent and Trademark Office*